United States Patent
Smith et al.

(12) 
(10) Patent No.: US 6,239,384 B1
(45) Date of Patent: *May 29, 2001

(54) MICROELECTRIC LEAD STRUCTURES WITH PLURAL CONDUCTORS

(75) Inventors: John W. Smith, Palo Alto; Joseph Fjelstad, Sunnyvale, both of CA (US)

(73) Assignee: Tessera, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/020,754

(22) Filed: Feb. 9, 1998

Related U.S. Application Data

(63) Continuation-in-part of application No. 08/715,571, filed on Sep. 18, 1996
(60) Provisional application No. 60/003,927, filed on Sep. 18, 1995.

(51) Int. Cl.[7] ........................................... H01R 9/09
(52) U.S. Cl. .................. 174/261; 257/668; 257/692; 257/734; 257/774; 361/772
(58) Field of Search ................... 174/260, 261; 257/666, 668, 692, 734, 758; 361/772, 774

(56) References Cited

U.S. PATENT DOCUMENTS

| | | | |
|---|---|---|---|
| 3,628,105 | 12/1971 | Sakai et al. | 257/664 |
| 4,912,547 | * 3/1990 | Bilowith et al. | 257/758 |
| 5,390,844 | 2/1995 | Distefano et al. | 228/180.4 |
| 5,394,009 | 2/1995 | Loo | 257/666 |
| 5,398,863 | 3/1995 | Grube et al. | 228/106 |
| 5,489,749 | 2/1996 | DiStefano | 174/261 |
| 5,491,302 | 2/1996 | Distefano et al. | 174/260 |
| 5,518,964 | 5/1996 | DiStefano et al. | 438/113 |
| 5,536,909 | 7/1996 | DiStefano et al. | 174/261 |
| 5,798,751 | 8/1998 | Nakajima | 345/138 |
| 5,878,486 | 3/1999 | Eldridge et al. | 29/840 |

FOREIGN PATENT DOCUMENTS

| | | |
|---|---|---|
| 0421343 A2 | 4/1991 | (EP) . |
| 0489177 A1 | 6/1992 | (EP) . |
| 1-95 539 | 4/1989 | (JP) . |
| WO 94/03036 | 2/1994 | (WO) . |

OTHER PUBLICATIONS

Electrical Characterization of the Interconnected Mesh Power System (IMPS) MCM Topology by Schaper, et al., 1994 IEEE, pp. 791–795.

Thin Film Module; 700 IBM Technical Disclosure Bulletin, Jan. 31, 1989, No. 8, Armonk, NY, US;; pp. 135–138.

Electrical Design of Digital Multichip Modules, by Paul D. Franzon, Chapter 11 in the treatise Multichip Module Technologies and Alternatives—The Basics, Doane and Franzon, eds. 1993, pp. 525–568.

\* cited by examiner

Primary Examiner—Albert W. Paladini
(74) Attorney, Agent, or Firm—Lerner, David, Littenberg, Krumholz & Mentlik, LLP

(57) ABSTRACT

A microelectronic connection component has flexible leads formed by polymeric strips with metallic conductors thereon. The metallic conductors may be very thin, desirably less than 5 microns thick, and provide good fatigue resistance. Each strip may have two conductors thereon, one serving as a principal or first signal conductor for connection to a first contact on a chip or other microelectronic element and the other serving as potential reference or ground conductor, or as a second signal conductor connected to a second contact on the chip. The system provides enhanced resistance to crosstalk and rapid signal transmission, and is compatible with differential signal transmission.

35 Claims, 13 Drawing Sheets

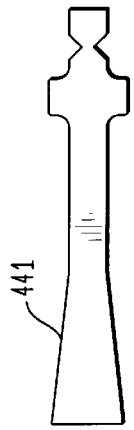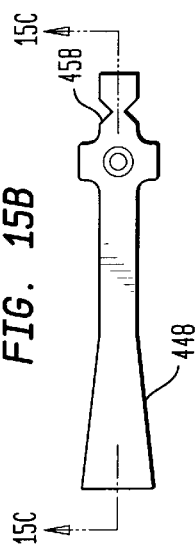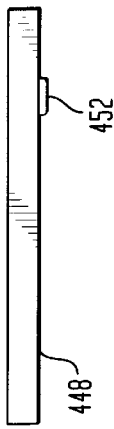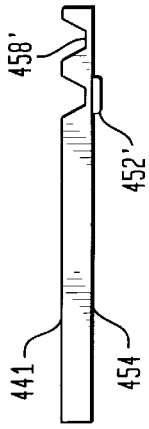
FIG. 15A  FIG. 15B  FIG. 15C  FIG. 15D
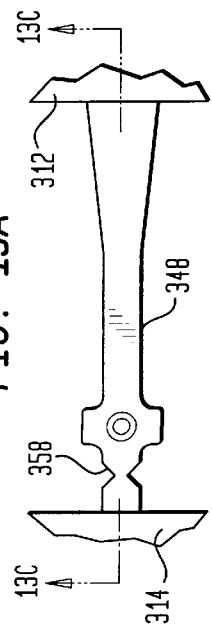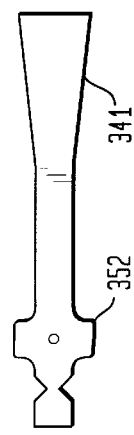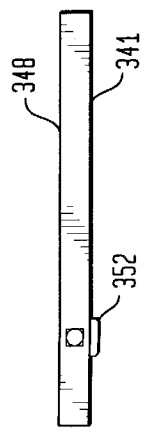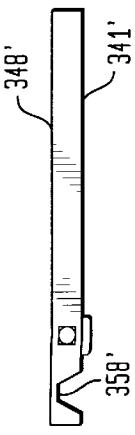
FIG. 13A  FIG. 13B  FIG. 13C  FIG. 13D

MICROELECTRIC LEAD STRUCTURES WITH PLURAL CONDUCTORS

CROSS REFERENCE TO RELATED APPLICATIONS

The present application is a continuation in part of U.S. patent application Ser. No. 08/715,571, filed Sep. 18, 1996, which in turn claims benefit of U.S. Provisional Application No. 60/003,927 filed Sep. 18, 1995. The disclosures of both of said applications are incorporated by reference herein.

FIELD OF THE INVENTION

The present invention relates to components and methods used in mounting and connecting microelectronic elements such as semiconductor chips.

BACKGROUND OF THE INVENTION

Semiconductor chips and other microelectronic elements typically have contacts which must be connected to external circuitry, such as the circuitry of a supporting substrate or circuit panel. Various processes and components for making these connections have been provided heretofore. For example, in a wire bonded assembly the chip is physically mounted on a substrate and individual fine wires are connected between the contacts of the chips and contact pads on the substrate. In tape automated bonding or "TAB" processes, a dielectric supporting tape such as a thin foil of a polymer is provided with a hole slightly larger than the chip. An array of metallic leads is provided on one surface of the dielectric tape. These leads extend inwardly from around the hole so that an inner end of each lead projects inwardly beyond the edge of the hole. These ends are arranged side by side at spacings corresponding to the spacings of the contacts on the chip. The inner ends of the leads are bonded to the contacts on the chip, whereas outer ends of the leads are attached to contact pads on the substrate. In the "beam lead" process, the chip is provided with leads extending from contacts on the chip outwardly beyond the edges of the chip. The chip is positioned on the substrate so that the outer ends of the leads lie over the appropriate contact pads of the substrate and the leads are bonded to the contact pads.

The rapid evolution of the semiconductor art has created a need for progressively greater numbers of contacts and leads in a given amount of space. An individual chip may require hundreds or even thousands of contacts and leads. For example, a complex semiconductor chip in current practice may have rows of contacts spaced apart from one another at center to center distances of 0.5 mm or less. These distances are decreasing progressively with continued progress in the semiconductor art. With such closely spaced contacts, the leads connected to the chip contacts such as the wires in wire bonding and the leads used in the TAB and beam lead processes must be extremely fine structures, typically less than 0.1 mm wide. These fine structures are susceptible to damage and deformation during manufacture. Even minor deviation of a lead from its intended position during the bonding process can result in defects in the final assembly.

As disclosed, for example, in U.S. Pat. Nos. 5,489,749 and 5,536,909 and in PCT Published International Application WO 94/03036, published Feb. 3, 1994, all of which are incorporated by reference herein, a component for mounting a semiconductor chip may include a support structure such as a polymeric film defining one or more gaps and one or more leads extending across such gap. The supporting structure typically has terminals on it. Each lead has a connection section with a first end permanently secured to the supporting structure on one side of the gap and a second end remote from the first end. The first ends of the lead connection sections typically are connected to the terminals. The second end of each connection section may be releasably secured to the opposite side of the gap. For example, each lead may include a frangible section connecting the second end of the connection section to the support structure. Thus, each lead bridges across the gap in the support structure. The leads are maintained in the proper position and orientation so that when the connection component is juxtaposed with the chip, each lead is at or near the desired position relative to the associated contact on the chip. Each lead is then engaged by a bonding tool which enters the gap and forces each lead downwardly into engagement with the appropriate contact of the chip. Preferably, each lead is guided by the bonding tool during this operation. Because each lead is supported at both ends, the leads remain in position before the bonding process. When the leads are bonded to the contacts of the chip, the terminals on the supporting structure are electrically connected to the chip. Thus, the chip can be connected to external circuitry by attaching the terminals on the supporting structure to a larger substrate, as by solder bonding the terminals to the larger substrate. The bonded leads typically provide flexible interconnections between the contacts of the chip and the terminals and thus allow compensation for thermal expansion and contraction of the chip and substrate. Components and bonding methods as disclosed in the '749 and '909 patents and in the '036 International Publication provide rugged, compact and economical chip mountings, and offer numerous advantages. Still further improvements and enhancements to such chip mountings are disclosed in U.S. Pat. Nos. 5,398,863 and 5,491,302, the disclosures of which are hereby also incorporated by reference herein. Bonding tools useful in attaching leads according to the '794 patent and '036 publication and for other purposes are disclosed in U.S. Pat. No. 5,390,844, the disclosure of which is also incorporated by reference herein.

The connection sections of leads made in accordance with the aforementioned patents and publication most typically are made from metals such as copper, gold, platinum, nickel, aluminum, silver and alloys of these metals. Combinations of multiple metal layers may also be employed. The '749 and '909 patents also disclose the use of polymeric strips, such as polymeric strips formed integrally with the support structure, in the leads. Thus, the polymeric strips serve as part of the lead structure, along with one or metal layers. In certain embodiments disclosed in these patents, the frangible sections are formed by interrupting the metal layers. In these embodiments, the polymeric layer extends across the frangible section, so that the polymeric layer breaks when the end of the connection section is displaced downwardly into engagement with the chip. As further disclosed in these patents, the polymeric strips can be employed in cantilevered leads, i.e., in leads which are not supported at both ends prior to bonding in accordance with the preferred embodiments of the patents. Still other structures taught in these patents provide the polymeric strip as a reinforcement only adjacent the first end of the lead connection section, i.e., only where the lead joins the support structure, so as to alleviate stress concentration at this point. The remainder of the lead is composed only of the metal layers.

Other lead structures are disclosed in U.S. Pat. No. 5,518,964, the disclosure of which is also incorporated by reference herein. As shown in certain embodiments of the '964 patent, a microelectronic connection component may include a dielectric sheet having an array of elongated, striplike leads. Each lead may have a terminal end permanently fastened to the sheet and a tip end detachably connected to the sheet. In use, the sheet can be juxtaposed with a microelectronic element such as a chip or an entire wafer. The tip ends of the leads are bonded to the contacts on the chip while the tip ends remain attached to the sheet. After bonding, the sheet and he microelectronic element are moved away from one another, thereby detaching the tip ends from the sheet and bending the leads away from the sheet. This leaves the leads in a vertically extensive, flexible configuration.

Despite these improvements, still further improvements would be desirable. Thus, improvements in the structure of polymer reinforced leads to facilitate fabrication of such leads and to facilitate the bonding process would be desirable.

It also would be desirable to provide lead designs which offer even better resistance to the respected flexure encountered during operation, and which can provide good resistance to such failure even when formed with relatively brittle, fatigue-prone metals.

Moreover, the electrical characteristics of interconnecting elements can affect the performance of the microelectronic circuit as a whole. As described, for example, in Electrical Design of Digital Multichip Modules, by Paul D. Franzon, chapter 11 in the treatise Multichip Module Technologies and Alternatives—The Basics, Doane and Franzon, eds, 1993, pp. 525–568, the electrical characteristics of interconnecting elements can influence the speed of operation of the circuit. Although a full treatment of the electrical design of microelectronic circuitry is beyond the scope of this disclosure, the quality of signal transmission, and the time required for signal propagation from one microelectronic element to another will depend upon factors such as the lengths and the characteristic impedances of the transmission lines constituting the connection and the like. Conductors extending within the interiors of circuit panels commonly are provided as "striplines." In a stripline, the conductor carrying the signal is juxtaposed with a voltage reference plane such as power plane or a ground plane. A dielectric layer typically is provided between the conductor and the reference plane.

However, the leads which extend from circuit panels to the chip contacts typically have not been provided as striplines heretofore. Thus, in the wire bonding, TAB and beam lead processes, the leads are single conductors, without any voltage reference plane in proximity to the conductor. The leads thus have electrical properties such as characteristic impedances markedly different from the striplines of the circuit panels. Moreover, leads utilized in the aforementioned structures are susceptible to "crosstalk." Signals propagating on one lead can induce spurious signals on adjacent leads and on the connected elements of the circuit. The problem of crosstalk is aggravated by close physical spacing of the leads and further aggravated as the operating speeds of the circuit elements increase. It would be desirable to provide microelectronic connection components and methods which offer better control of electrical characteristics in the leads and better resistance to crosstalk. It would be particularly desirable to provide such leads in a compact and economical structure which is compatible with closely-spaced contacts on the microelectronic element.

SUMMARY OF THE INVENTION

The present invention addresses these needs.

One aspect of the present invention provides a microelectronic connection component including a dielectric support structure and a plurality of flexible leads attached to the support structure. Each lead includes a flexible dielectric member, a principal conductor and a reference conductor extending codirectionally with the principal conductor along the dielectric member. Preferably, each flexible dielectric member is a dielectric strip having top and bottom surfaces. The principal conductor of each lead overlies either the top or the bottom surface of the strip and the reference conductor overlies the opposite surface of the strip. The support structure desirably is a flat, sheetlike element having top and bottom surfaces continuous with the top and bottom surfaces of the strips. Terminals may be disposed on one or more surfaces of the support structure and the principal conductors of the leads may be connected to the terminals. The strips and the support structure may be formed integrally with one another and may have either the same thickness of different thicknesses. Most preferably, the support structure and strips are formed as parts of a common dielectric sheet. The component preferably includes a conductive first potential reference element or potential plane overlying a surface of the support structure. The reference conductors of at least some of the leads are electrically connected to the first potential reference element.

In one arrangement, the first potential reference element overlies the top surface of the support structure and the first potential reference element has holes in it. The terminals are disposed on the top surface of the substrate in the holes. At least some of the terminals are electrically isolated from the first potential reference element. The reference conductors of the leads overlie the top surfaces of the strips and are continuous with the first potential reference element whereas the principal conductors of the leads are disposed on the bottom surfaces of the strips. The component may include electrically conductive vias extending from at least some of the terminals to the bottom surface of the support structure, the principal conductors of at least some of the leads being connected to the vias, as by electrically conductive traces extending along the bottom surface of the support structure.

In components according to this aspect of the invention, the reference conductor, principal conductor and dielectric, form paired conductors extending along the flexible leads. Each such paired conductor may be continuous with further striplines or paired conductors defined by the traces and the first potential reference element. The paired conductor leads are substantially immune to crosstalk. The leads connections are adapted to be bonded to contacts on chips or other microelectronic elements.

A further aspect of the invention includes an assembly including a component as discussed above together with a microelectronic component having a front surface facing the bottom surfaces of the support structure and the strips, the microelectronic element having contacts on its front surface. The principal conductors of the leads are connected to the contacts on the microelectronic element, and the reference conductors of the leads extend to the vicinity to the contacts.

Yet another aspect of the present invention provides a connection component including a support structure and one or more flexible leads. Each lead includes a connection section having a first end attached to the support structure and the second end remote from the first end. Each such lead includes a flexible dielectric strip extending between the first and second ends, the strip having oppositely directed top and bottom surfaces. Each such lead also includes a first conductor or conductive layer overlying one of the surfaces of the strip. The first conductor is less than ten microns thick, more preferably less than about 5 microns thick and most preferably between about 2 microns and about 5 microns thick. The component according to this aspect of the invention may further include a second conductor overlying the other surface of the flexible dielectric strip. The second conductor may have the same thickness as discussed above with reference to the first conductor. The first and second conductors desirably are metallic. The dielectric strip desirably is a flexible polymeric strip between about 10 microns and about 50 microns thick. According to this aspect of the invention, the flexible dielectric strip provides a significant portion, and desirably the majority, of the structural strength of the lead connection section. Thus, the conductive layers serve principally to provide electrical conductivity. This aspect of the invention incorporates the realization that very thin layers, less than 10 microns and desirably less than about 5 microns thick can provide excellent flex fatigue resistance, even where the conductive layers are formed from materials such as metals commonly regarded as brittle or lacking in flex fatigue resistance. Thus, metallic conductive layers can be formed from low cost metals such as copper and copper based alloys. The metallic layers may include plural smaller layers or coatings of other metals such as gold or may be formed entirely from metals such as gold. Even where relatively costly metals such as gold are employed, the amounts of gold required to form such thin layers are minimal. Moreover, with such thin conductive layers, the processing times required for plating or etching the layers are markedly reduced.

Most preferably, the second end of the connection section in each lead is releasably attached to the support structure. For example, the second end of each lead may be attached to the support structure by means of a frangible section in the lead. Leads according to this aspect of the present invention provide advantages similar to those discussed above with reference to the '749 and '909 patents. A particularly preferred connection component according to this aspect of the present invention has the flexible polymeric layer extending from the first end of the connection section to the second end of the connection section, but not extending across the frangible section. Thus, the frangible section is devoid of the polymeric layer but includes one or more of the metallic layers. Particularly where very thin metallic layers as discussed above are employed, the metallic layer can be readily broken and provides a reliable frangible connection.

According to yet another variant of the present invention, the leads with polymeric layers as aforesaid can be incorporated in structures as described in the '964 patent and can be used in processes of bonding and deforming as discussed in such patent.

Further aspects of the present invention provide connection components with leads adapted to facilitate bonding. Thus, each lead includes a connection section as aforesaid having a first end attached to the support structure and having a second end remote from the first end. Here again, each connection section includes a polymeric strip with oppositely directed top and bottom surfaces and a first metallic layer overlying one of these surfaces. The connection components according to this aspect of the present invention have metallic projections extending downwardly from the metallic layers of the leads and protruding downwardly from the remainder of the lead in a bond region adjacent the second end of the connection section. The metallic projection aids in concentrating sonic or ultrasonic energy applied through the lead. Where the first metallic layer is disposed on the top surface of the polymeric strip, the projection may extend through the strip. Alternatively, the layer forming the principal conductor for bonding to the contact on the chip or other microelectronic element may be positioned on the bottom surface of the strip. In this case, the dielectric strip desirably has a hole in it in the bond region. As further discussed below, a bonding tool can be engaged in the hole so that energy can be coupled directly from the tool to the metallic layer on the bottom surface, without the need to transmit the energy through the intervening polymeric layer. Moreover, the hole can provide firm interengagement between the tool and the lead and thus can allow the tool to guide the lead during the bonding process.

A further aspect of the invention provides a microelectronic connection component including a dielectric support structure having electrically conductive elements such as traces, terminals, potential planes and the like. The component further includes a plurality of separate flexible leads. Each such lead has a fixed end permanently attached to the support structure and a tip end movable with respect to such structure. At least some of said leads are double connection leads. Each said double connection lead includes a flexible dielectric member, a first conductor and a second conductor, such as the principal conductor and reference conductor discussed above, the conductors extending codirectionally along the dielectric member. The two conductors of each said double connection lead are connected to different electrically conductive elements on said support structure. In a connection component according to this aspect of the invention, both the first conductor and second conductor of each said double connection lead are exposed at a bottom surface of each said lead adjacent the tip end thereof. Thus, each conductor can be engaged with a separate contact on a microelectronic element such as a chip when the bottom surface of the lead tip end overlies the contact-bearing surface of the microelectronic element.

In a preferred connection components according to this aspect of the invention, the electrically conductive elements on said support structure include elongated traces electrically insulated from one another and extending along the support structure, at least some of said double connection leads having first and second conductors electrically connected to different ones of said traces. The traces preferably include a plurality of trace pairs, the traces of each said pair extending adjacent to one another over at least a part of the length of said traces, the traces of each said pair being connected to the first and second conductors of one said double connection lead at a first end of the pair. In some embodiments according to this aspect of the invention, the traces of at least one said trace pair are connected to the first and second conductors of another said double connection lead at a second end of the pair. As further discussed below, connection components in accordance with these aspects of the invention can provide continuous, controlled-impedance dual-conductor signal paths extending all the way to the chip contacts connected to the tip ends of the leads. Alternatively or additionally, the electrically conductive elements on the support structure may include terminals, at least some of the terminals being disposed in pairs adjacent to one another, the terminals of at least one such pair being connected to the first and second conductors of the same lead. Components according to this aspect of the invention can be used to provide a controlled impedance, dual-path transmission lines extending between the contacts of the chip at the tips of the leads and similar controlled impedance dual path transmission lines in an external substrate Another aspect of the invention provides a microelectronic assembly which includes a connection component having double connection leads each including two conductors, and a chip or other microelectronic element having contacts. Preferably, at least some of the contacts on the chip are arranged in pairs so that the contacts of each pair are adjacent one another. A first conductor of a double connection lead is connected to a first contact of a pair, whereas the second conductor of the same double connection lead is connected to the second contact of the same pair. The microelectronic element typically includes a plurality of electronic components. Desirably, at least some of the pairs of contacts have both the first contact and the second contact electrically connected to the same component in said microelectronic element. This arrangement is particularly preferred where the component is a differential signal transmitter arranged to send a first signal to the first contact of one said pair and to send and a second signal to the second contact of the same pair, said second signal being an inverted version of said first signal. Signals of opposite sense will be sent along the first and second conductors of the double connection lead connected to such pair of contacts, and through the remainder of the dual-path transmission line. For the same reasons, this arrangement is preferred where the component is a differential signal receiver arranged to accept a first signal from the first contact of a pair and to accept a second signal from the second contact of the same pair, and to respond to a difference between said first and second signals. This arrangement can also be used where the connected component has a local ground node for applying or receiving a constant potential connected to one contact of the pair and a signal node connected to the other contact of the same pair. As further discussed below, assemblies in accordance with this aspect of the invention can provide rapid and interference-free transmission of signals between electrical components in plural chips or between electrical components in the same chip.

Still further aspects of the present invention provide methods of bonding connection components as aforesaid and methods of making microelectronic components as aforesaid.

BRIEF DESCRIPTION OF THE DRAWINGS

FIGS. 13A and 13B are fragmentary, diagrammatic top and bottom views depicting portions of a component in accordance with yet another embodiment of the invention.

FIG. 13C is a sectional view taken along line 13C in FIG. 13A.

FIG. 13D is a view similar to FIG. 13C but depicting a component in accordance with another embodiment of the invention.

FIGS. 15A and 15B are fragmentary, diagrammatic bottom and top views, respectively, of a component in accordance with yet another embodiment of the invention.

FIG. 15C is a sectional view taken along line 15C in FIG. 15B.

FIG. 15D is a view similar to FIG. 15C but depicting a component in accordance with yet another embodiment of the invention.

DETAILED DESCRIPTION OF THE PREFERRED EMBODIMENTS

Figure 1:
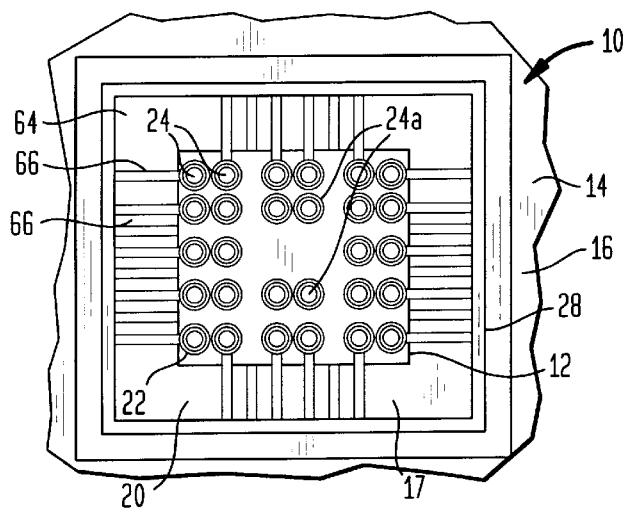
FIG. 1 is a diagrammatic top view of a component in accordance with one embodiment of the invention, taken in conjunction with a semiconductor chip.
Figure 2:
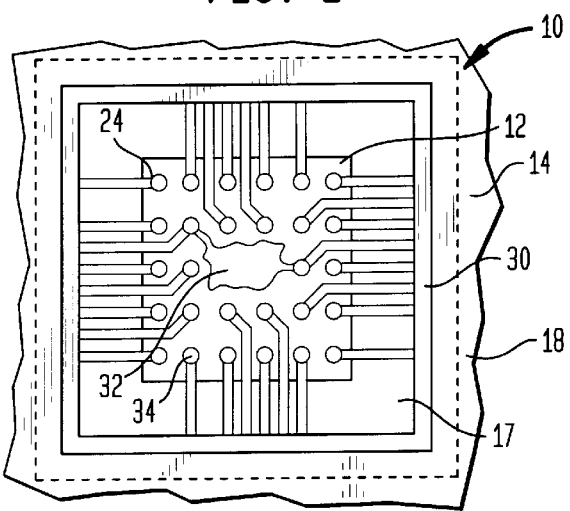
FIG. 2 is a diagrammatic bottom view of the component depicted in FIG. 1.
Figure 5:
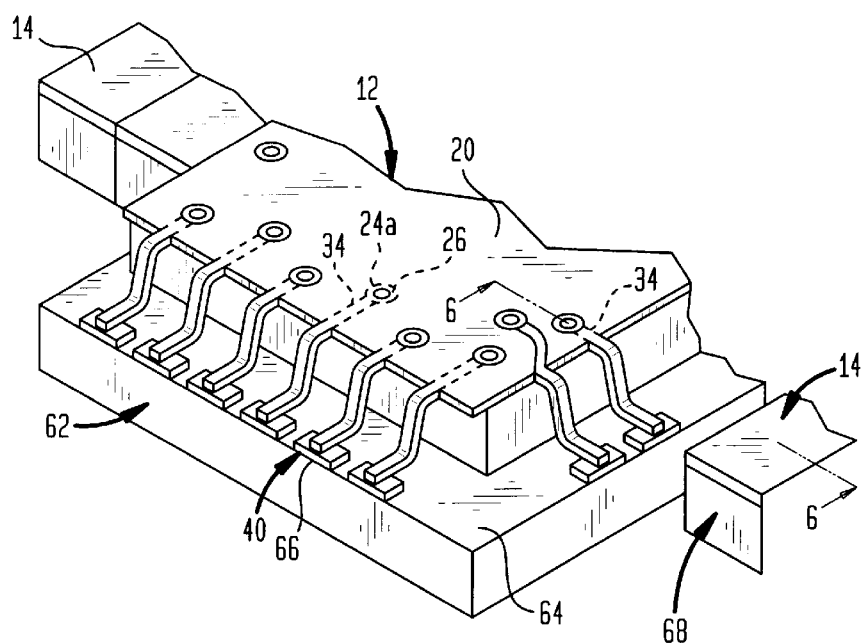
FIG. 5 is a fragmentary, diagrammatic sectional view depicting the assembly made from the chip and components of FIGS. 1–4.
Figure 6:
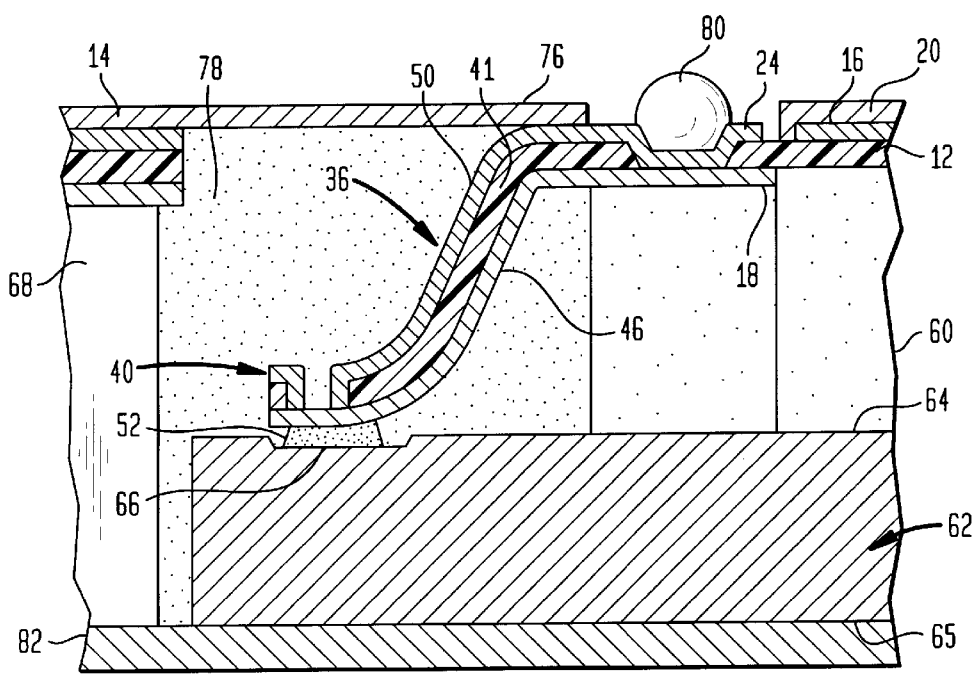
FIG. 6 is a fragmentary, diagrammatic sectional view taken along line 6—6 in FIG. 5, but depicting the assembly at a later stage of manufacture.

A connection component in accordance with one embodiment of the invention includes a polymeric film support structure 10 having a central region 12, a peripheral region 14 and a series of slots 17 separating the central region from the peripheral region. Slots 17 are united with one another to form a ring-like, annular channel surrounding the central region. The support structure or film 10 may be formed from a flexible, sheetlike dielectric material such as the material sold under the trademark KAPTON E by the DuPont Chemical Corporation, polyimide, preferably between about 10 microns and about 50 microns thick and more preferably between about 10 microns and about 25 microns thick. Film 10 has a top surface 16 visible in FIG. 1 and a bottom surface 18 visible in FIG. 2. In the central region 12, top surface 16 is substantially covered by a first potential reference plane 20 in the form of a thin, metallic conductive layer. Layer 20 can be used as a ground plane as discussed below. Layer 20 has numerous holes 22 formed therein. A plurality of metallic via liners 24 extend through holes 22 and through the support structure or dielectric film to the bottom surface 18 in central region 12. Each such via liner 24 provides an exposed terminal on the top surface 16 of the supporting structure. Most of the via liners 24 are electrically isolated from layer 20, and do not contact the layer. A few via liners 24a are electrically connected to layer 20 by small flexible metallic bridges 26 extending inwardly from the edge of the hole 22 to the via liner 24a, as best seen in FIG. 5. A metallic bus 28 extends around peripheral region 14, parallel to the outer edges of slots 17 on the top surface 16 of the support structure. A similar bus 30 extends around the peripheral region on the bottom surface 18 of the support structure.

A second potential reference element 32 is disposed on the bottom surface of the support structure in central region 12. The second potential reference element 32 may also be a thin layer of a metal. Potential reference element 32, however, only covers a relatively small portion of the central region. A plurality of metallic traces 34 extend along the bottom surface of the central region, from the bottom ends of the via liners 24 towards the edges of the central region and hence towards slots 17.

A plurality of leads 36 extend across slots 17. Each lead 36 has a connection section with a first end 38 attached to the central region 12 of the support structure and a second end 40 remote from the central region of the support structure and remote from first end 38. The connection section of each lead includes a dielectric strip 41 having a top surface 44 continuous with the top surface 16 of the support structure in central region 12 and a bottom surface 46 continuous with the bottom surface 18 of the support structure in the central region. Each lead further includes a principal conductor 48 in the form of a metallic strip overlying the bottom surface 46 of strip 41 and a potential reference conductor 50 overlying the top surface of strip 41. Conductors 48 and 50 are formed as thin metallic layers. Preferable, conductors 48 and 50 are less than about 10 microns thick, more preferably less than about 5 microns thick and most preferably between about 2 microns and about 5 microns thick. Each principal conductor 48 is continuous with a trace 34, so that each principal conductor is electrically connected to at least one of the via liners 24 and hence is electrically connected to at least one of the terminals defined by the via liners on the top surface. A few of the traces 34 are electrically connected to the second potential reference element 32, so that the particular principal conductors 48 attached to these traces are connected to several via liners. Thus, all of the traces, principal conductors 48 and via liners 24 which are connected to the second potential reference element 32 are electrically connected to one another. As further explained below, these elements serve as the power connections for the associated semiconductor chip. All of the potential reference conductors 50 of the various leads are continuous with the first potential reference element or ground plane 20.

Figure 3:
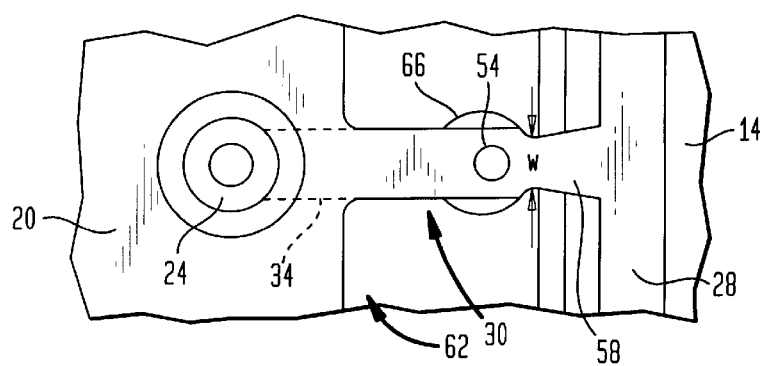
FIG. 3 is a fragmentary view on an enlarged scale depicting portions of the component illustrated in FIG. 1.

Each lead 36 has a projection 52 extending downwardly from the principal conductor or metallic layer 48 in a bond region of the connection section, adjacent the second end 40 thereof. Each lead also has a hole 54 extending downwardly into polymeric layer 41 in the bond region, in alignment with projection 52 and a hole in the potential reference conductor 50 aligned with hole 54, so that hole 54 is open to the top surface of the component. The metallic layer forming the potential reference conductor 50 on the top surface of each polymeric strip 41 is continuous with the bus 28 on the top surface of the peripheral region 14. However, the polymeric strips 41 and lower metal layers 48 are interrupted to provide gaps 56 in these layers between the second end 40 of the connection section and the polymeric layer of peripheral portion 14. This leaves the second end 40 of the securement section attached to the peripheral portion 14 only through a small portion 58 of the metallic layer on the top surface. As best seen in FIG. 3, the width W of this portion 58 is smaller than the width of adjacent portions of the metallic layer. Metallic layer portion 58 thus constitutes a frangible connection between the second end 40 of the connection section and the peripheral portion 14 of the support structure. A compliant dielectric pad 60, formed from a soft material such as a foam, gel or elastomer is disposed beneath the bottom surface 18 of the central portion.

Figure 4:
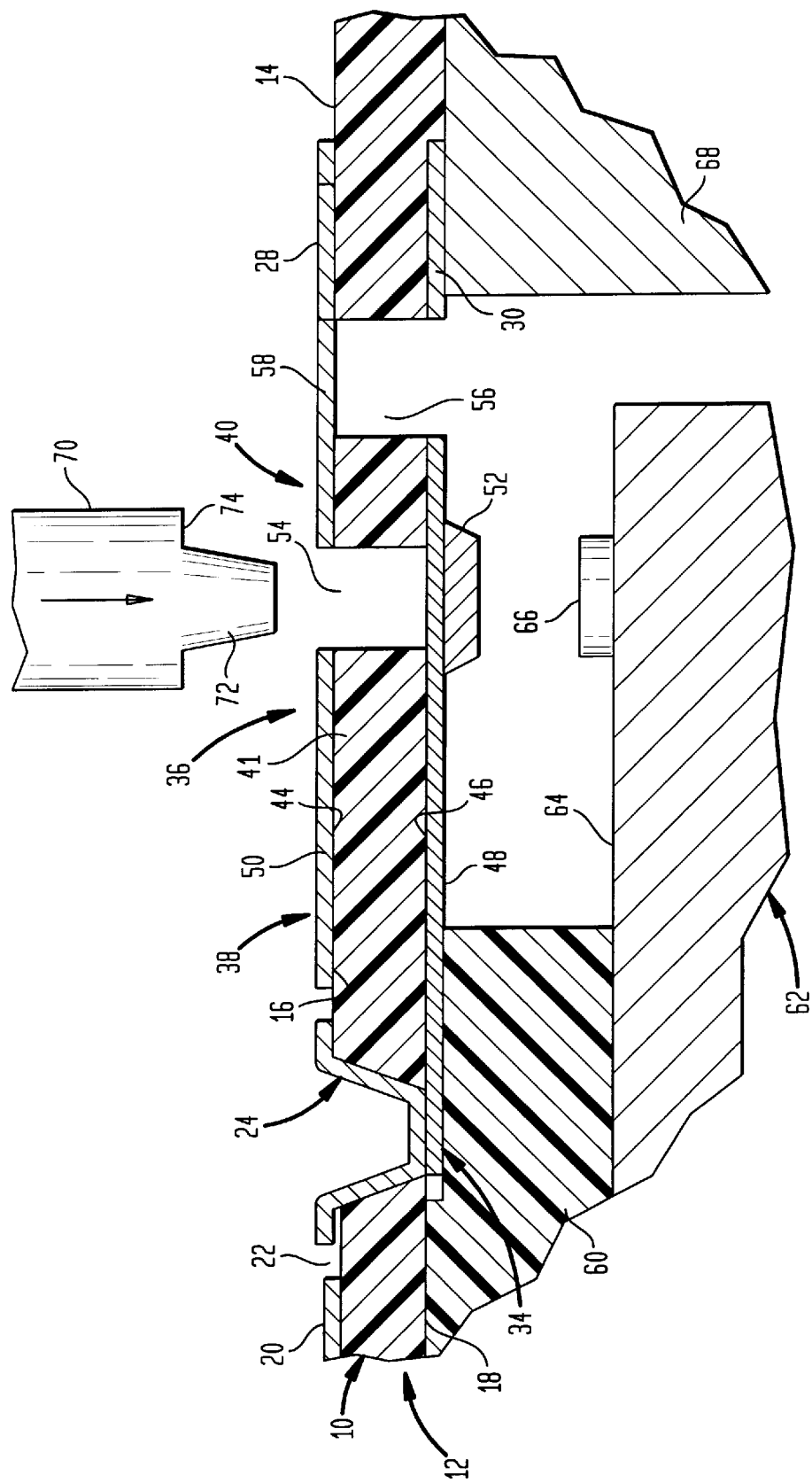
FIG. 4 is a fragmentary diagrammatic sectional view taken along line 4—4 in FIG. 3, showing the chip and component in conjunction with a bonding tool.

In use, the connection component is assembled to a chip 62 having a front surface 64 with contacts 66 thereon. Contacts 66 are arranged in rows along the periphery of the chip. The connection component is aligned with the chip so that each row of contacts 66 extends along one of the slots 17. The connection sections 36 of the leads, and particularly, bond regions and projections 52 of the leads are aligned with the contacts 66. The central region 12 of the support structure overlies the center of the chip and is supported on the front face 64 of the chip through the compliant layer 60. A ring-like support 68 surrounds the periphery of the chip and supports the peripheral region 14 of the support structure. A bonding tool 70 is advanced downwardly from the top of the assembly into engagement with each lead 36. As best seen in FIG. 4, the bonding tool has a projection 72 at its bottom end. The projection is slightly longer than the combined thickness of the top metal layer or reference conductor 50 and dielectric strip 41, so that projection 72 bears on the top surface of the lower metal layer or principal conductor 48. A shoulder 74 on the tool may also bear on the top metal layer or reference conductor 50. As the tool travels downwardly, it forces the second end 40 of the connection section downwardly, thereby breaking the top metal layer in frangible section 58.

Continued motion of the tool forces the second end 40 of the connection section downwardly until the projection 52 engages a contact 66 on the chip. During its downward motion, the bonding tool 70 may move laterally so as to guide each lead into precise alignment with the appropriate contact 66. The bonding tool may be controlled by appropriate machine vision systems (not shown). The bonding tool preferably also moves longitudinally with respect to the lead in the direction towards the first end 38 of the lead, thereby forming the lead into a generally curved S-shaped configuration. These processes of lead alignment, bending and bonding are more fully described in the patents incorporated by reference herein. However, in the process using the lead of FIGS. 1–6, engagement between the bonding tool and the lead is effected by engagement of projection 72 in hole 54. This engagement allows the lead bonding tool to move the second end of the lead both laterally and longitudinally. When the lead has been engaged with the appropriate contact 66, projection 52 bears on the contact. Energy is applied through tool 70, as by applying heat and sonic or ultrasonic energy to bond projection 52 to contact 66. Because projection 72 bears directly on the metal of the lower metal layer or principal conductor 48, the energy is transmitted efficiently in metal to metal contact, without passing through the polymeric dielectric strip 41.

The resulting assembly has the central portion 12 of the support structure overlying the central portion of the chip front surface 64, and has the connection sections 50 of the various leads attached to terminal 66 on the chip. The principal conductor or lower metal layer 48 on the bottom surface of each polymeric strip is connected to a contact 66 of the chip. Thus each contact 66 of the chip is connected to a trace 34 on the bottom surface of central region 12 and to one of the via liners 24 thereby connecting each contact to a terminal on the top surface of the central region or chip carrier 12. As discussed above a few of the traces 34 and hence a few of the principal conductors 46 and chip contacts 66 are connected in common to the second potential reference element 32 (FIG. 2) on the bottom surface of central region 12. These connected leads preferably are used as the power connection for the chip. Thus, the particular chip contacts so connected are the power input terminals of the chip. The potential reference conductors 50 and first potential reference element 20 are electrically isolated from most of the principal conductors 46. Thus, the lead connection sections 36 provide individual stripline connectors, with a pair of electrically isolated, coextensive conductors 46 and 50. As discussed above, a few of the vias 24a are electrically connected to the first potential reference element 20, thereby connecting a few of conductors 46 and a few chip contacts 66 to the first potential reference element. Preferably, the first potential reference element and these connected chip contacts and terminals are connected to ground potential and serve as a ground reference for the assembly.

A solder mask layer 76 (FIG. 6) is applied over the top surface of central region 12 and over the top surface of peripheral region 14. The solder mask layer has openings aligned with via liners or terminals 24. A soft, compliant encapsulant such as a gel or an elastome 78 is provided beneath the solder mask layer, in the spacings surrounding lead connection sections 36. Electrically luctive bonding materials such as solder balls 80 are provided on terminals 24. The rear surface 65 of chip 62, and the corresponding surface of support 68 may be covered by an appropriate metallic thermal spreader 82. The resulting assembly is a completely packaged chip. It may be mounted to a circuit board or other circuit panel by activating bonding material 80, using standard surface mount techniques.

In service, changes in dimensions due to heating and cooling may cause movement of via liners or terminals 24 relative to chip contacts 66, both in horizontal directions parallel to the front face 64 of the chip and in vertical directions towards and away from the chip. Compliant layer 60 and flexible leads 36 and flexible chip carrier or support structure central region 12 allow free movement of the terminals relative to the chip contacts. During such movement, leads 36 flex. The extremely thin metallic conductors 46 and 50 can flex without undergoing substantial fatigue. Therefore, the metallic conductors are substantially resistant to fatigue failures induced by repeated flexure of the leads. The encapsulant 78 further limits the stresses on the leads and enhances fatigue resistance of the assembly.

In operation, as signals are transmitted between terminals 24 and chip contacts 66, the dual-conductor leads provide substantial resistance to crosstalk between signals on adjacent leads. Traces 34 and the first potential plane element or ground plane 20 also provide a dual conductor, stripline lead configuration for transmission of signals along the bottom surface of the chip carrier or central region 12. Because the dual conductor or stripline lead configuration is carried through into leads 36, there is good continuity between each lead and the associated trace; there is a smooth transition with no abrupt change in characteristic impedance per unit length at the juncture of the trace and the lead. All of these factors facilitate operation of the system at high speeds.

Preferably, the first potential reference element 20 on the top surface of central portion 12, the reference conductors 50 on the top surfaces of strips 41 and bus 28 on the top surface of the peripheral region are formed integrally with one another, whereas traces 34 on the bottom surface of the central region, the principal conductors 46 on the bottom surfaces of the strips and bus 30 on the bottom surface of the peripheral region are also integral with one another. Most preferably, the component is fabricated starting with a continuous polymer sheet covered with continuous metallic layers on its top and bottom surfaces. The metallic layers are etched to form the various features, as by applying selective masking layers and photographically patterning the masking layers. The slots 17, holes 54 and gaps 56 in the polymeric layer, as well as the vias in layer 10 which accommodate via liners 24 may be formed by laser ablating and/or chemically etching the polymeric layer. During the formation process, the metallic elements may serve as masks in etching or ablation of the polymeric layer. The top and bottom metallic layers, and hence the potential plane elements, conductors and traces may be formed from metals such as copper or other copper-based alloys, most preferably beryllium copper. Each metal layer may also include one or more additional layers or coatings of metals such as gold, platinum or the like. The sublayers may be about 0.2 to about 2.0 microns thick. These protect the underlying metals from oxidation and corrosion. Via liners 24 and projections 52 may be formed from copper, nickel, gold or other suitable materials. The via liners and projections preferably are deposited by conventional plating processes. The bottom surfaces of projections 52 preferably are covered with a layer of gold or other suitable material forming a metallurgical bond with the chip contact 66.

A component according to a further embodiment of the invention has leads 136 (FIG. 7) similar to the leads of the component illustrated in FIGS. 1–6. Thus, each lead includes a polymeric strip 141 with a reference conductor or top metal layer 150 overlying the top surface of the strip and with a principal conductor or bottom metal layer 148 overlying the bottom surface of the strip. Again, the first end 138 of each lead is permanently connected to a dielectric sheet or support structure 110, whereas the second end 140 of each lead is releasably attached to the dielectric sheet or support structure by a frangible element 158 constituted by a small portion of the top metal layer bridging from the second end of the lead to the support structure. In this embodiment, however, the leads are arranged in a "area array" or grid extending over substantially the entire surface of the support member. Each lead extends across an individual gap or hole 117 in the support structure. Terminals or vias 124 are also arranged in an area array extending over substantially the entire surface of the support structure, so that the terminals are interspersed with the leads and holes. The principal conductor 148 of each lead is connected to the bottom end of a neighboring via 124 by a short trace 134 extending along the bottom surface of the support structure. The top surface of the support structure is substantially covered by a first potential reference element 120 on the top surface of the support structure, the potential reference element 120 being integral with the reference conductors 150 on the top surfaces of the leads. Vias 124 extend through the dielectric support layer 110 and also extend through holes in the potential reference element 120 on the top surface. Thus, vias 124 and the associated principal conductors 148 and traces 134 on the bottom surface are electrically isolated from the first potential reference element on the top surface. However, a few vias 124a are connected to the first potential reference element by bridges 126 similar to those discussed above.

Figure 7:
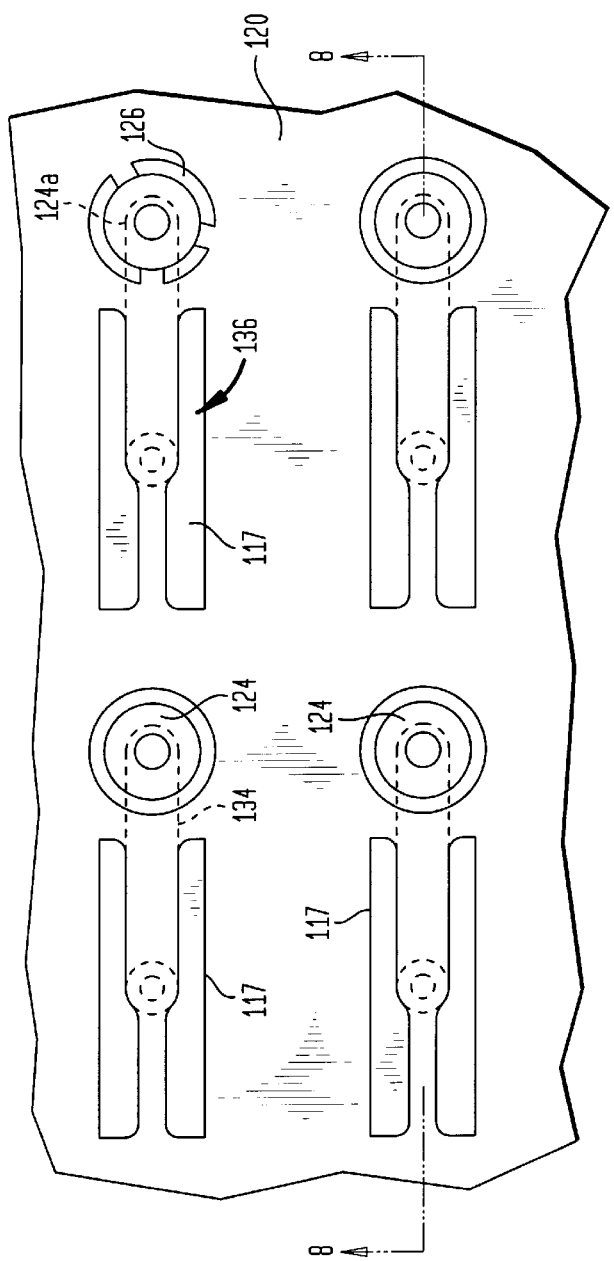
FIG. 7 is a fragmentary top view depicting a portion of a component in accordance with a further embodiment of the invention.
Figure 8:
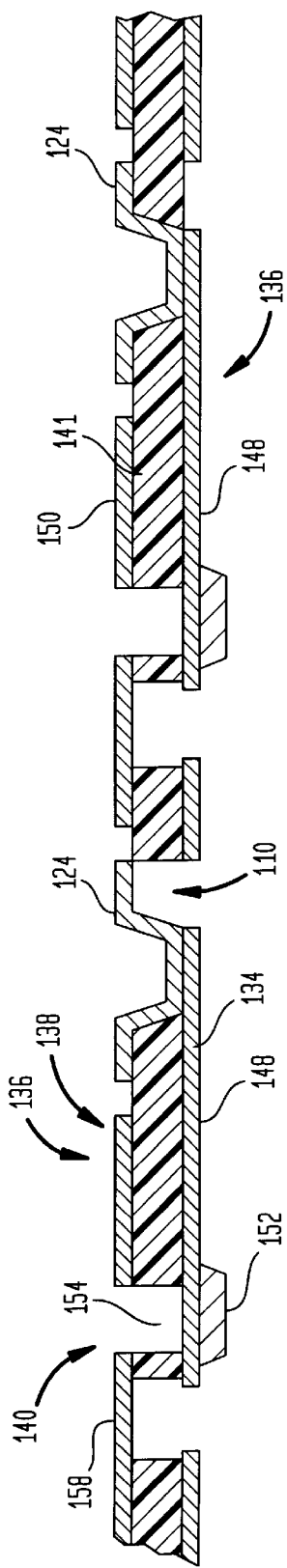
FIG. 8 is a sectional view taken along line 8—8 in FIG. 7.

The component depicted in FIGS. 7 and 8 may be utilized in substantially the same manner as the component discussed above with reference to FIGS. 1–6, but with a chip having contacts distributed in an area array covering the chip front surface. Once again, the component is positioned over the contact-bearing front surface of the chip and supported above the front surface of the chip by a compliant layer (not shown) having apertures aligned with holes 117. A tool, similar to the tool discussed above with reference to FIG. 4, may be engaged with the hole 154 in the top of each lead so as to force each lead downwardly and engage the projection 152 with the contact on the lead.

Figure 9:
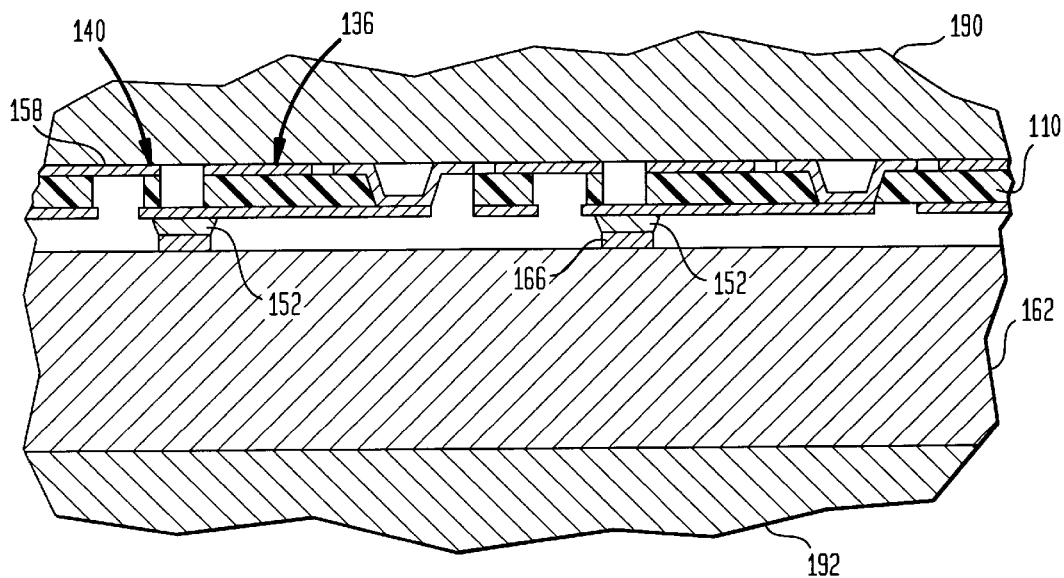
FIG. 9 is a view similar to FIG. 8 but depicting the component in conjunction with a chip during a later stage of manufacture.
Figure 10:
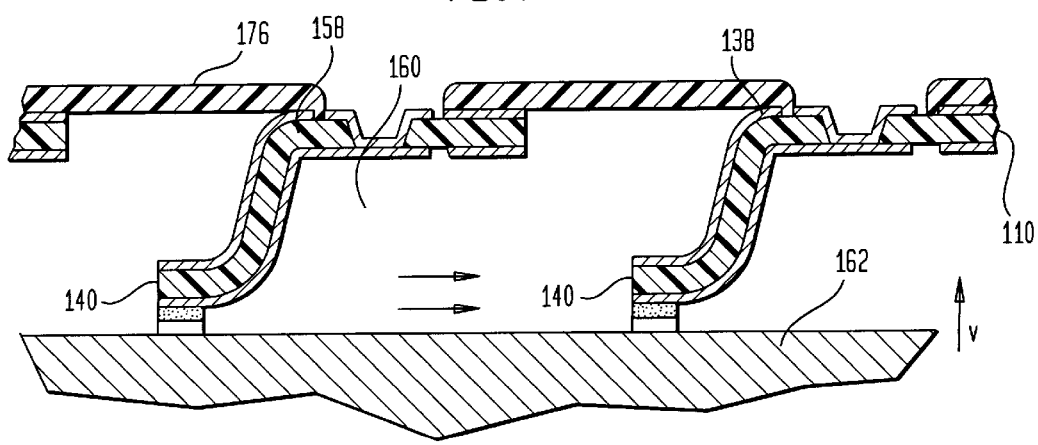
FIG. 10 is a view similar to FIG. 9 but depicting the component and chip at a later stage in manufacture.
Figure 11A:
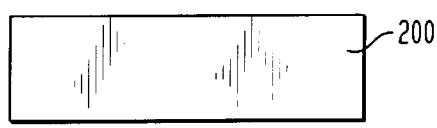
FIGS. 11A through 11H are fragmentary views depicting portions of the component of FIGS. 7–10 during successive stages of its manufacture.

The components discussed above may also be used in a bonding procedure as depicted in FIGS. 9 and 10. The component, depicted in FIGS. 7 and 8, including the support structure 110 with the leads thereon is aligned with the microelectronic element 162. The component and microelectronic element are disposed between a pair of opposed platelike tools 190 and 192 and are forced together under heat and pressure so as to bond the projections 152 on the bottom surfaces of the leads to the contacts 166 of the chip. During this bonding procedure, the tip or second ends 140 of leads 136 are retained in position on the dielectric support layer 110 by the frangible elements 158. After bonding, a solder mask layer 176 (FIG. 10) is applied over the top surface of the component, thereby closing the holes 117 (FIG. 7) in the dielectric support layer. The component and the microelectronic element 162 having moved relative to one another with a component of motion in a vertical direction V such that the support structure 110 of the connection component moves upwardly away from microelectronic element 162. The tip or second ends 140 of the leads thus move downwardly relative to the terminal or first ends 138 of the leads, thereby bending the leads into a vertically extensive, generally S-shaped configuration. A flowable, liquid compliant material 160 is injected between the dielectric layer 110 of the connection component and the front surface of chip 162, and cured to form a soft, compliant layer in place between the dielectric layer and the chip front surface. The bonding, moving and injecting procedures, can be substantially in accordance with the aforementioned U.S. Pat. No. 5,518,964. The step of moving the dielectric layer and chip relative to one another may be performed in whole or in part by injecting a fluid under pressure between the dielectric layer and the microelectronic element or chip. The fluid injected under pressure may be the flowable liquid encapsulant 160, or else may be a gas which is subsequently replaced by the flowable liquid. As further disclosed in the '518 patent, the vertical movement of the dielectric layer and the microelectronic element may be accompanied by relative movement in a horizontal direction, so as to move the second or tip end 140 of each lead towards the first or terminal end 138 of the lead thereby facilitating bending of the leads into an S-shaped. Alternatively, the vertical movement may be accomplished without the relative horizontal movement of the dielectric sheet 110 and microelectronic element or chip 162. Thus, as taught in U.S. Pat. No. 5,518,964, the leads may be curved in the horizontal plane in the component as manufactured. This facilitates vertical movement. In other arrangements, leads with polymeric strips and with metallic conductors overlying the polymeric strips in accordance with the present invention may be fabricated in the physical configurations described in U.S. Patent provisional patent application No. 60/003,619 filed Sep. 12, 1995 and assigned to the same assignee as the present application, the disclosure of which is hereby incorporated by reference herein, or as described in the non-provisional patent application claiming benefit of said provisional application entitled Lead Configurations, filed Sep. 12, 1996 and naming Thomas DiStefano and John W. Smith as inventors, which application is also assigned to the present assignee and which application is also incorporated by reference herein. Further, leads in accordance with the present invention may be fabricated in the configuration taught in the commonly assigned United States provisional patent application of Thomas DiStefano entitled, Curved Lead Configurations filed Sep. 12, 1996, the disclosure of which is also incorporated by reference herein.

If the component is to be used in the assembly method of FIGS. 9 and 10, the projections 152 on the tip or second ends of the leads are provided with bonding materials suitable for activation by heat or pressure as taught in the aforementioned '964 patent. Among the suitable bonding materials which can be used are eutectic bonding materials. For example, where the leads or the chip contacts include gold, the bonding material may include a metal selected to form a low melting eutectic with gold, such as a metal selected from the group consisting of tin or germanium and combinations thereof. Other suitable bonding materials include diffusion bonding materials adapted to form a bond between the conductive metal layer or principal conductor and the contacts on the chip without formation of a liquid phase; solder; or metal bearing polymeric compositions. Alternatively, each of the lead tip ends may be bonded to the associated chip contacts by engaging the lead with a tool as discussed above with reference to FIGS. 1–8, without bending the leads downwardly. After bonding, the dielectric layer 110 can be moved away from the microelectronic element 162 so as to bend the leads downwardly and break the frangible section 158 in the manner described above with reference to FIGS. 9 and 10.

Figure 12A:
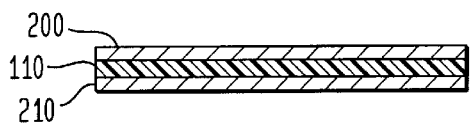
FIGS. 12A through 12H are diagrammatic sectional views of the components depicted in FIGS. 11A through 11H respectively.
Figure 12B:
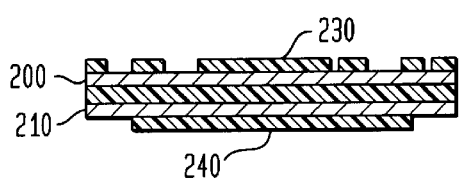
Figure 11B:
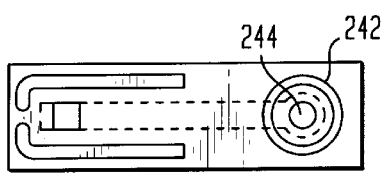
Figure 12C:
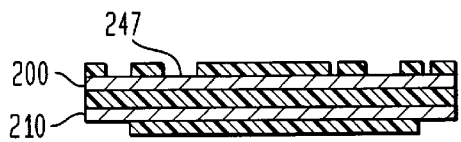
Figure 11C:
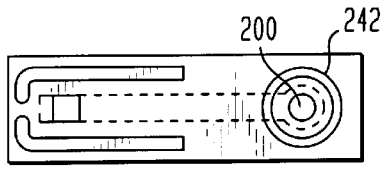
Figure 12D:
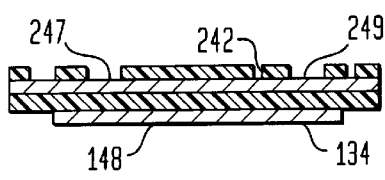
Figure 11D:
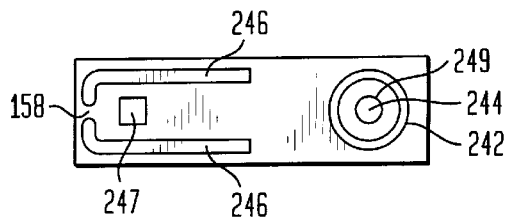
Figure 12E:
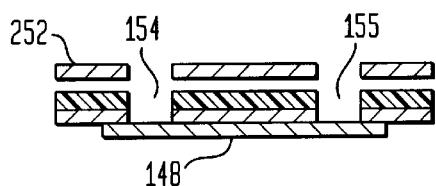
Figure 11E:
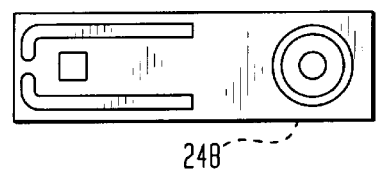
Figure 12F:
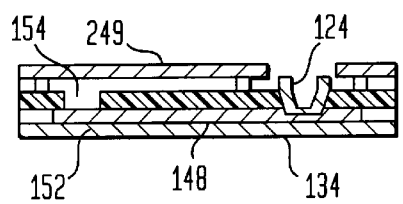
Figure 11F:
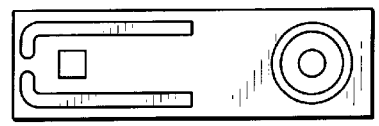
Figure 12G:
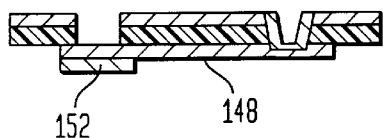
Figure 11G:
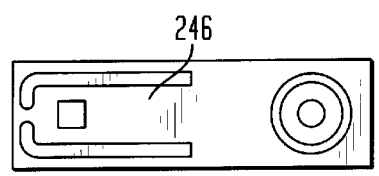
Figure 12H:
Figure 11H:
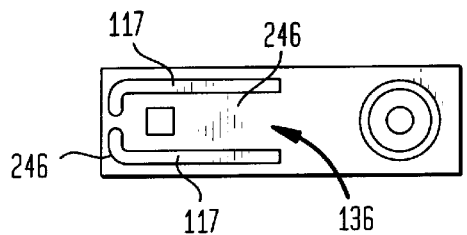

As shown in FIGS. 11A–11H and 12A–12H, a process for making the component of FIGS. 7–10 begins with a dielectric layer 110 having continuous layers 200 and 210 of metals as discussed above on its top and bottom surfaces respectively. Photoresists 230 and 240 are applied on the top and bottom metal layers 200 and 210 and photographically patterned as shown in FIGS. 11B and 12B. The top and bottom layers are then etched as illustrated in FIGS. 11C and 12C. The photoresists are removed leaving the dielectric layer 110 with the patterned metal layers behind as illustrated in FIGS. 11D and 12D. This procedure forms holes 242 and rings 244 in the top metal layer. Rings 244 will ultimately form the top portions of via liners 124. The same processes also produce openings 246 in the top layer on the opposite sides of each area which is to form a lead. Openings 246 define a narrowed, bridge region which will constitute the frangible element 158. The masking and etching process also forms a hole 247 in the top metal layer adjacent the tip of each area which is to form the lead and a further hole 249 in the center of each ring 244. The resist pattering on the bottom layer and the etching of the bottom layer also forms the individual strips or principal conductors 148 on the bottom surface of the dielectric layer as well as the traces 134, constituting extensions of strips 148. Each trace 134 extends to beneath one hole 249 within a ring 244. Using a laser and a mask 252 formed from molybdenum or another material resistant to laser radiation, holes 154 and 155 are formed in layer 110 from the top surface, through the holes 247 and 249 in the top metal layer. During this process, the top metal layer also serves as a mask and precisely limits the location of holes 154 and 155. A further photoresist is then applied, leaving openings only in alignment with holes 249, and the conductive via liners 124 are formed in these holes, so that each via liner is metallurgically bonded to a trace 134. The via liners may be formed by conventional electroplating methods or other suitable deposition methods (FIGS. 11F and 12F). Using a further photoresist on the bottom surface, projections 152 are formed by plating the electrically conductive bonding material on to the tip regions of leads 148 (FIGS. 11G and 12G). After removing the photoresists, the dielectric layer is further ablated using a laser within openings 246 of the top layer, thereby forming holes 117 defining the elongated strip of dielectric material constituting the structural element of each lead 136.

Figure 14:
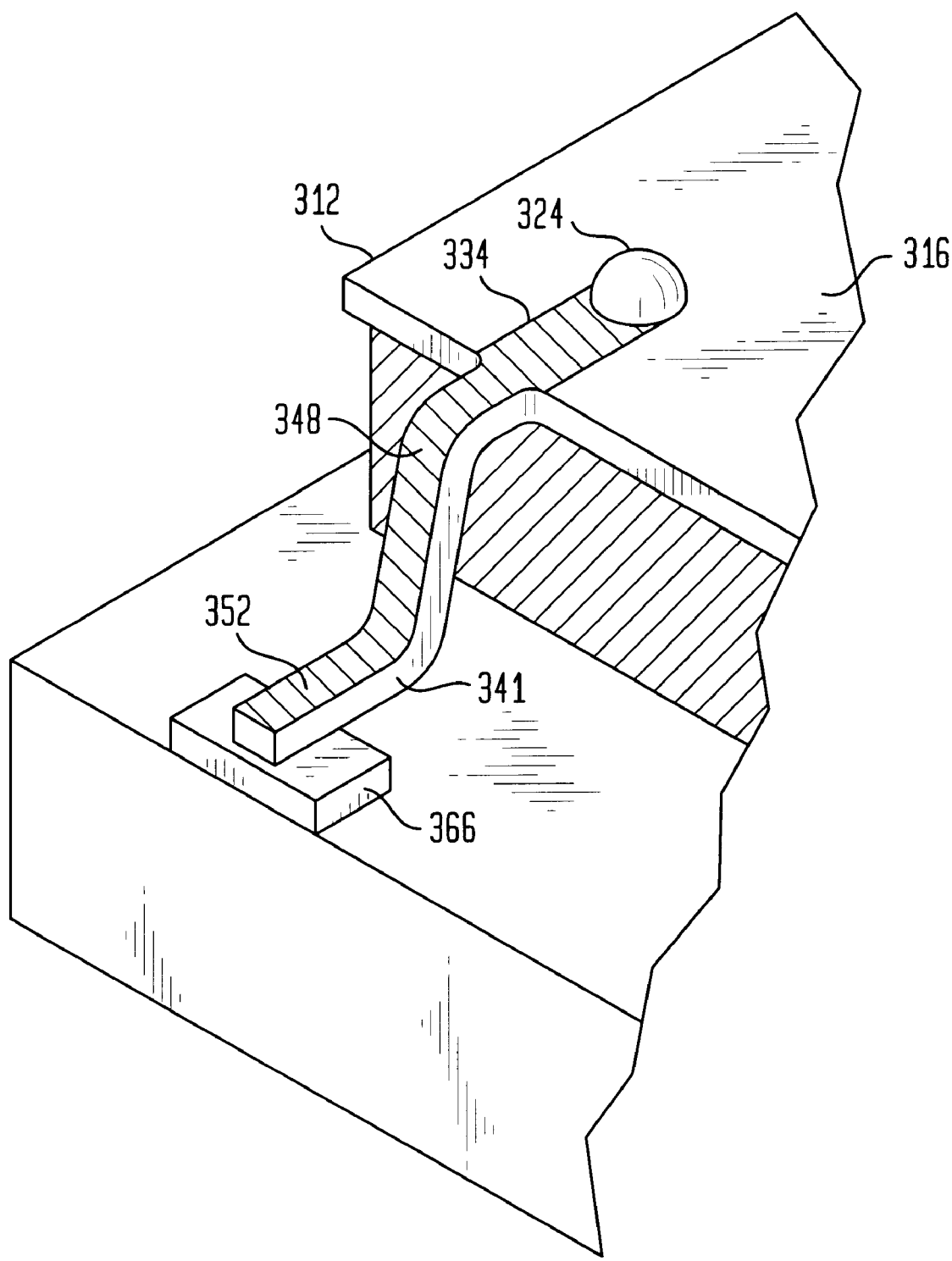
FIG. 14 is a fragmentary, diagrammatic perspective view depicting the assembly made with the component of FIGS. 13A–13B.

A component in accordance with a further embodiment of the invention (FIGS. 13A–13C and FIG. 14) has only one conductor 348 on the top surface of the polymeric strip 341. A conductive metal protrusion or bump 352 extends downwardly from conductor 348 through a hole in the polymeric dielectric layer 341 at the bond region of the lead. The frangible region 358 has a narrower width than the adjacent portion of the lead, but includes both the metallic layer or conductor 348 and the polymeric layer 341. In this arrangement, the lead does not have a hole extending into its top surface. When the lead is used, it is engaged by a bonding tool as taught in U.S. Pat. No. 5,390,844. Thermal and ultrasonic energy can be applied through the top surface of metallic layer 348 and transmitted through the metallic projection 352 to a contact on the chip. The leads illustrated in FIGS. 13A–13C and in FIG. 14 are connected to a central region 312 and a peripheral region 314 of the dielectric support structure and may be arranged generally as discussed above with reference to FIGS. 1–6. Here again, each lead may be forced downwardly by the bonding tool, so that the frangible sections 358 of the individual leads are broken. As best seen in FIG. 14, the single conductor or metallic layer 348 on the top surface of polymeric strip 341 is continuous with a trace 334 extending along the top surface 316 of the dielectric layer in the central region or chip carrier 312. After bonding, the lead has the configuration as illustrated in FIG. 14, with projection 352 being bonded to the contact 366 of the chip. The lead and the associated trace 334 thus make connection to a terminal 324 on the top surface of central portion 316. Connection components and assemblies in accordance with this embodiment of the invention do not provide the potential reference conductor on the flexible leads and hence do not provide the enhanced electrical characteristics associated with such reference conductors. However, components in accordance with this embodiment of the invention do provide the enhanced flexibility and fatigue resistance afforded by the use of a polymeric strip lead with only a thin metallic conductor layer. As illustrated in FIG. 13D, leads in accordance with this general arrangement may be provided with a frangible section 358' having an interruption in the polymeric layer 341' so that the frangible section 358' bridged solely by a narrow section of the metallic layer 348'.

A lead in accordance with a reverse arrangement is depicted in FIG. 15a–15c. This lead incorporates a polymeric layer 441 having top and bottom surfaces and a single metallic layer or conductor 448 on the bottom surface of strip 441. Here again, the frangible section 458 is constituted by a narrowed region of the lead, with both the polymeric and metal layers. A small projection of a bondable material 452 extends downwardly from the bottom metallic layer 448. This lead also has only a single, principal conductor constituted by layer 448. In the connection component, the conductor or layer 448 is continuous with a trace (not shown) on the bottom surface of the support structure. Each such trace may be connected to a terminal on the bottom surface of the support structure or else may be connected to a terminal on the top surface of the support structure by a via arrangement similar to those discussed above. The lead depicted in FIG. 15b is similar except that this lead has a frangible section 458' in which the polymeric layer 441 is removed and also has a hole 454 in the bond region of the lead in registration with the projection 452' for engagement by a bonding tool as discussed above with reference to FIG. 4.

Figure 16:
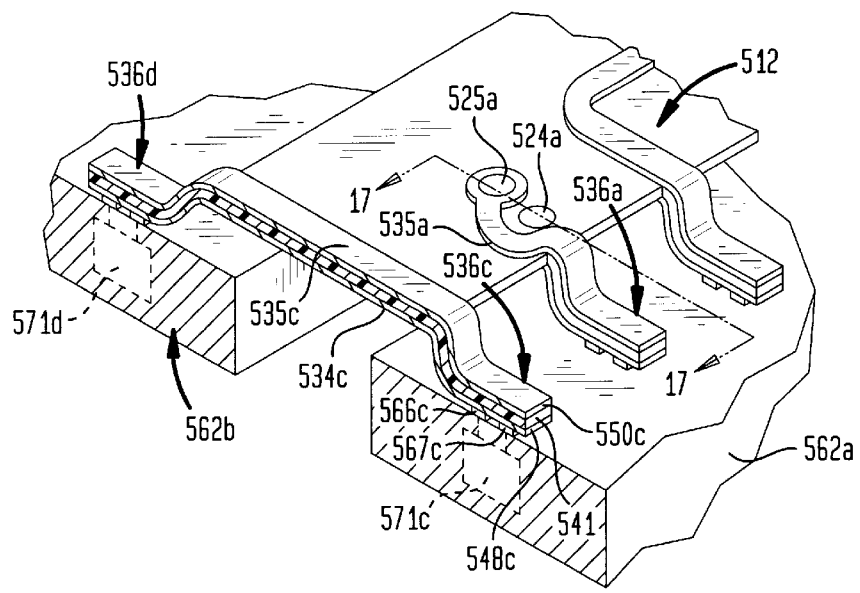
FIG. 16 is a fragmentary, diagrammatic, partially sectional perspective view of an assembly in accordance with a further embodiment of the invention.
Figure 17:
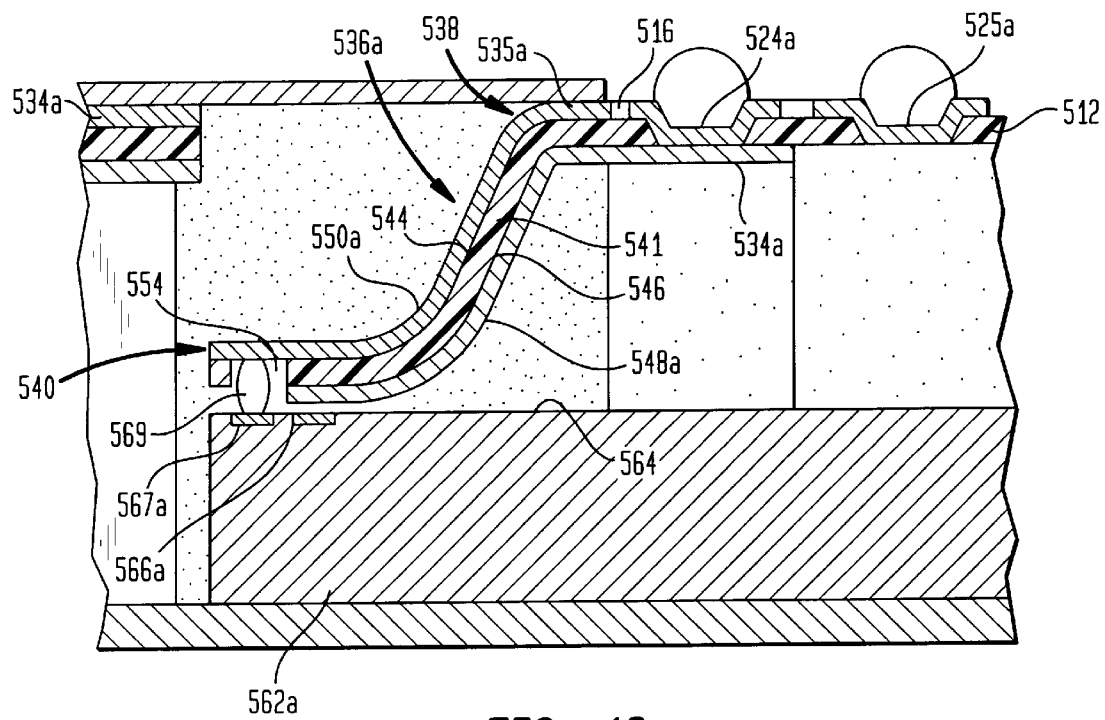
FIG. 17 is a fragmentary sectional view taken along line 17—17 in FIG. 16.

A connection component and assembly of FIGS. 16 and 17 are similar to the embodiments described above, except that both conductors are connected to two closely spaced, but distinct contacts on the chip or other microelectronic element. Leads which are connected in this manner are referred to herein as "double connection" leads. The connection component includes a dielectric support structure 512 having electrically conductive elements such as terminals 524a and 525a accessible at a top surface of the support and traces 534a extending along the top and bottom surfaces of the support. In practice, the support structure may have electrically conductive elements in several planes, separated by dielectric layers of the support. Also, the conductive elements may include other elements such as ground or power plane elements as described above. As in the embodiments discussed above, the connection component includes numerous leads 536a, each having two conductors 548a and 550a extending along a dielectric element 541 in the form of a polymeric strip. Some or all of these leads are connected as double connection leads. Thus, the connection component is juxtaposed with a semiconductor 562 so that lead 536a is aligned with a pair of contacts 566A and 567a which are adjacent to one another on the surface of microelectronic element 562a. For purposes of clarity, FIGS. 16 and 17 show only a few such double connection leads. However, the connection component preferably includes numerous double connection leads connected to many pairs of closely spaced contacts.

Like the leads discussed above, double connection lead 536a has a connection section with a first or fixed end 538 attached to the dielectric support structure 512 and a tip end or second end 540 remote from the support structure and remote from first end 538. Thus, the lead defines a distal direction away from the support structure, from the first end to the second end and the opposite, proximal direction. The connection section of lead 536 includes a dielectric strip or member 541 having a top surface 544 continuous with the top surface 516 of the dielectric support structure 512 and a bottom surface 546 continuous with the bottom surface 518 of the support structure 512.

Each flexible lead includes a first conductor 550 overlying the top surface 544 of strip 541 and which preferably extends to the second end 540 of the flexible lead. In addition, each lead includes a second conductor 548 overlying the bottom surface 546 of strip 541 and extending to a point just proximal to the second end of the lead. The first and second conductors are the same conductors as referred to by the terms "reference conductor" and "principal conductor" in connection with other embodiments. However, because both of these conductors typically are used to carry signals, the terms "first conductor" and "second conductor" are used with reference to the conductors of a double connection lead. Lead 536a also has a hole 554 extending upwardly into dielectric strip 541. The hole 554 is formed adjacent the second end 540 of the lead 536, in a portion of the dielectric strip 541 which extends distally beyond the end of the second conductor 548. Stated another way, the second conductor does not cover hole 554, so that the first conductor 550 is exposed and available for connection through the bottom of the flexible lead. In other embodiments, the second conductor 548 may extend entirely to the second end of the lead, with the hole 554 in the dielectric strip being aligned with a corresponding hole in second conductor 548.

The first and second conductors of each double connection lead are connected to separate conductive elements on the support structure. For example, the second conductor 548a of lead 536a is connected to a trace 534a on the bottom surface of the dielectric support, which in turn is connected to a terminal 524a. The first conductor 550a of the same lead is connected to a further trace 535a on the top surface and to a terminal 525a. Terminal 525a is disposed adjacent to terminal 524a. The first conductor 550c of lead 536c is connected to a trace 535c on the top surface of the dielectric support, whereas the second conductor 548c of the same lead is connected to a trace 534c on the bottom surface of the support. Traces 534c and 535c form a pair of traces extending adjacent to one another. The two traces of the pair extend physically parallel to one another. Each trace is constituted by a flat, strip-like conductive element having a width substantially larger than its thickness and having major surfaces extending in the widthwise and lengthwise directions. Typical metal lines formed by plating or by etching a thin metal film have this configuration. The flat, strip-like traces preferably are superposed over one another, with their major faces confronting one another and separated from one another by a dielectric layer in support 512. The conductors 550 and 548 of each double connection lead have a similar configuration. As depicted, each trace 534c and 535c is formed integrally with one conductor of lead 536c, whereas the dielectric layer is integral with the dielectric layer of the lead. At the end of trace pair 534c, 535c opposite from lead 536c, the traces are connected to the conductors of a further double connection lead 536d in the same way. Thus, the traces and leads form a continuous stripline with substantially constant impedance characteristics along its length. Although traces 534c and 545c are depicted as incorporating a single, straight run from end to end, in practice the traces may include bends or jogs, and may also include vertical transitions to different levels in the support structure. Even if it is not possible to maintain the superposed arrangement over the entire length of the traces, significant benefit can be obtained by providing the superposed arrangement over some part of the length, and by maintaining the traces of each pair as close to one another as is practicable.

In use, the connection component is juxtaposed with one or more microelectronic elements such as semiconductor chips 562a and 562b so that each double connection lead 536 is aligned with one of the pairs of contacts on a surface of a microelectronic element. For example, lead 536a is juxtaposed with contact pair 566a, 567a on chip 562a. Contact 567a is provided with a bump 569 projecting upwardly from the surface of the microelectronic element.

Next, a bonding tool (not shown) is advanced downwardly from the top of the assembly into engagement with each lead 536. The bonding tool forces the second end 540 of the lead downwardly until the second conductor 548 engages contact 566a. At about the same time, the bump 569 on the outer contact 567a is engaged in the hole 554 in the dielectric strip 541 so as to contact the first conductor 550.

Thus, first conductor 550a is bonded to contact 567a, whereas second conductor 548a is bonded to the other contact 566a of the pair. Such bonding may be performed using the bonding methods discussed above, such as sonic, ultrasonic or thermosonic bonding. Alternatively, the bonding may be performed by a heat-activated process or other process which does not require transmission of the vibrations through the polymeric material of the lead. Bonding materials, such as those discussed above with reference to FIGS. 9–10, may be provided on the conductors of the lead, on the contacts, or both to facilitate such processes. Preferably, both conductors of each lead are bonded to the associated contacts simultaneously, using the same bonding tool. The other double connection leads are bonded in the same manner.

The resulting assembly provides a connection component having a plurality of double connection leads connected to chip contacts, each such lead having two conductors electrically connected to a pair of contacts on the chip or other microelectronic element, the contacts of each pair being close to one another. Preferably, both contacts of each pair, and hence both conductors of the lead, are connected to the same electronic element of the chip. For example, both contacts 566c, 567c connected to the conductors of lead 536c are connected by internal circuitry of chip 562a to the same electronic device 571c within the chip.

Figure 18:
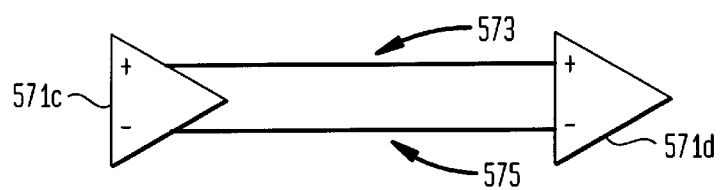
FIG. 18 is an electrical circuit diagram of a circuit in the assembly of FIGS. 16–17.

The parallel conductive paths provided by the conductors and by the associated elements can be employed in a differential-signal arrangement. As schematically indicated in FIG. 18, device 571c is arranged to send signals to device 571d through two separate signal paths 574 and 576 extending alongside of one another. Device 571c is a differential signal transmitter, arranged to transmit signals by varying the difference in potential applied to the two conductive paths, most preferably by applying equal but opposite-sense signals to the two conductive paths. For example, device 571c may provide a first digital output state by applying a relatively high voltage along path 574 and a low voltage along path 576, and may signal the opposite digital output state by applying a high voltage on path 576 and a low voltage on path 574. Stated another way, device 570 sends one signal on path 574 and sends an inverted version of the same signal on path 576. Device 572 is a differential signal receiver, which subtracts the two signals supplied on paths 574 and 576 to derive an input signal.

In the assembly of FIG. 16, the two conductive paths constituting the differential signal transmission line include the contacts 566c, 567c; the conductors 548c, 550c of lead 536c; the parallel traces 534c, 535c which connect lead 536c to lead 536d; the conductors of lead 536d and the pair of contacts connected to those conductors and associated with device 571d. These elements cooperatively provide a transmission line of well-controlled impedance, with the two signal paths physically close to one another over essentially the entire length of the transmission line. A differential signal arrangement using such a transmission line provides rapid, predictable signal transmission, and minimizes the effects of crosstalk or interference when signals are sent to the semiconductor chip. Because any electromagnetic interference will induce the same level of noise in both paths, the subtraction performed by the differential signal receiver win cancel out any noise induced in the signal paths. In other embodiments, the signal path including the one conductor of each lead may serve as a local ground whereas the path including the other conductor may serve as the signal carrying line. The receiver is arranged to detect the intended signal as the difference between the voltages on the first and second conductors.

The conductors 548a, 550a of double connection lead 536a and the associated traces and terminals 524a, 525a on the support structure can be used to provide a similar dual-path connection in a circuit which extends beyond the support structure. Thus, the conductors of lead 536a can be connected to a pair of traces in a substrate (not shown) providing a similar controlled-impedance dual path transmission line. Here again, the controlled-impedance dual-path transmission line extends all the way to contacts 566a, 567a on the chip.

The double connection leads can also be used in other arrangements which do not involve differential signaling. For example, the contacts of a pair may be connected within the chip to separate electronic devices. This arrangement is particularly advantageous where the frequency of the signals is relatively low, or where other factors limit the effect of crosstalk between the signals. Also, one conductor of a double connection lead can carry a constant reference potential such as power or system ground, in the manner discussed above with reference to FIGS. 1–10. Such a reference conductor may be connected to a potential plane element on the support structure, and may also be connected to a power or ground contact on the chip. Of course, a single connection component may include any combination of multi-conductor leads, some connected as double connection leads and others with only one conductor connected to the microelectronic element and serving only as a reference conductor, and may also include conventional single-conductor leads, with or without a polymeric reinforcement. The double connection leads may be placed on the support structure in arrangements other than the rows of leads depicted in FIG. 16. For example, the double connection leads, with or without other leads, can be disposed in an array as discussed above with reference to FIGS. 9–10.

Figure 19:
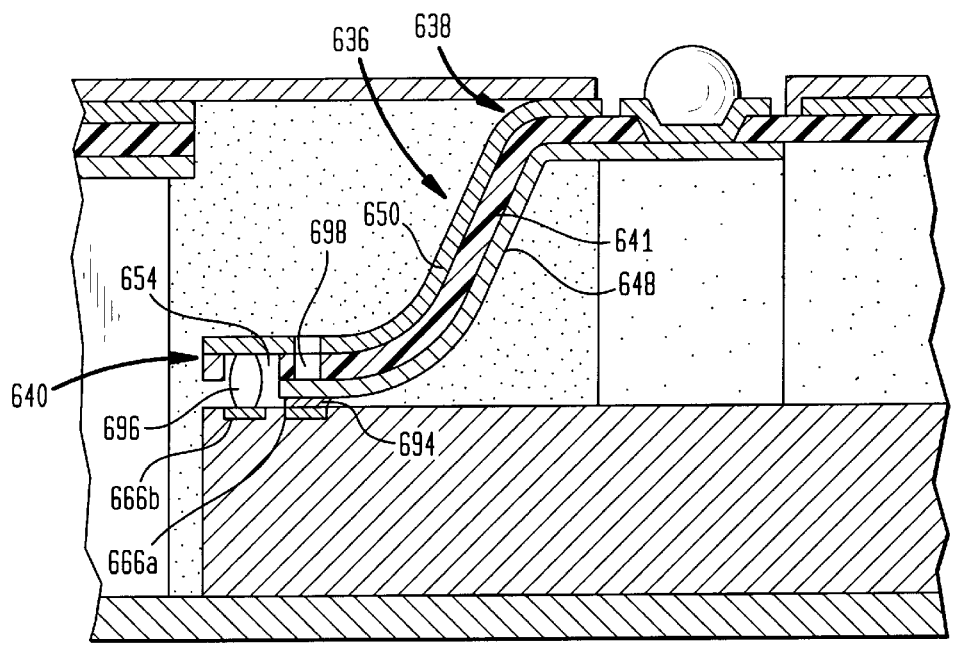
FIG. 19 is a view similar to FIG. 17 but depicting an assembly in accordance with yet another embodiment of the invention.

FIG. 19 shows another embodiment which is substantially similar to the embodiment shown in FIG. 16. However, the flexible leads 636 have been modified so that the second conductor 648 may be more readily bonded to the inner contact 666A using thermocompression or thermosonic bonding. In this particular embodiment, a second hole 698 is formed downwardly through the first conductor 650 and the dielectric strip 641 so that the second conductor 648 is accessible through the top of the lead 636. The second hole 698 provides an opening so that a bonding tool (not shown) may be inserted into the second hole 698 for bonding the second conductor 648 to the inner lead 666A using thermosonic or thermocompression bonding. The second hole 698 is preferably only large enough to pass a bonding tool therethrough and so that the first conductor 650 at the second end 640 of the lead 636 remains electrically connected to the portion of the first conductor 650 at the first end 638 of the lead 636. In this embodiment, the first conductor 650 may be electrically connected to the outer contact 666B by thermosonic bonding by using conductive projection 696, or by use of a fusible conductive material (e.g. solder), a conductive adhesive or epoxy (e.g. Au-epoxy) or an anisotropic conductive material.

Figure 20:
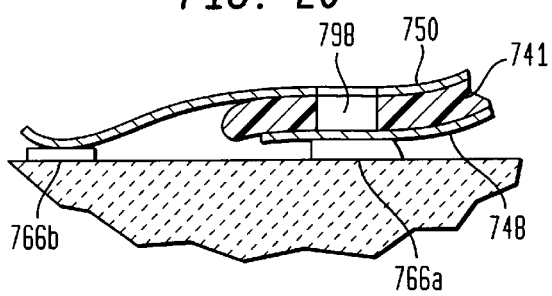
FIGS. 20, 21 and 22 are fragmentary sectional views depicting portions of assemblies in accordance with still further embodiments of the invention.

The lead partially depicted in FIG. 20 is similar to the lead of FIG. 19, and includes a similar hole 798 extending through the polymeric layer 741 and through the first conductor 750 at the location where the second conductor 748 is to be bonded to a contact 766a. In the lead of FIG. 20, however, the first or top-side conductor 750 extends distally beyond the dielectric layer 741 and beyond the first or bottom-side conductor 748, so that the first or top-side conductor 750 can be bent downwardly into engagement with a contact 766b. Before bonding, the first or top-side. conductor may be integral with a frangible section (not shown) connecting the distal end of this conductor to an anchor section (not shown) on the support structure so as to hold the distal end of the lead in place, in the manner discussed above with reference to FIGS. 3–4.

Figure 21:
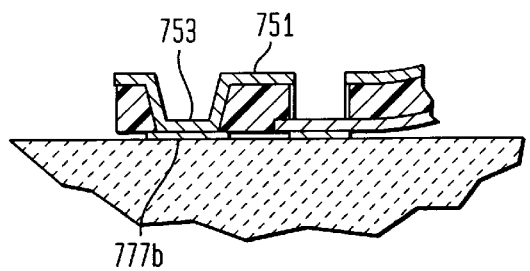

In the lead of FIG. 21, the first or top-side conductor 751 is provided with a conductive via liner 753 projecting downwardly through the dielectric layer so that the via liner can be bonded to a contact 777b. Thus, no projection on the contact is required. The second or bottom-side conductor terminates proximal to of via liner 753. In other respects, this lead is the same as the lead of FIG. 19.

Figure 22:
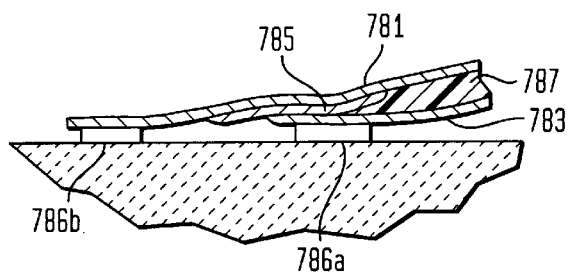

The lead of FIG. 22 has a first or top-side conductor 781 projecting distally beyond the second or bottom-side conductor 753. A supplementary dielectric layer 785 is provided between the conductors in the region where the bottom-side conductor will be bonded to contact 786a. This supplementary dielectric layer terminates proximal to the region where the top-side conductor 781 is bonded to contact 786b. The polymeric dielectric 787 which extends along the remainder of the lead, to the proximal end and support structure (not shown) overlaps with the supplementary dielectric 785 but terminates proximal to the region where the bottom side lead is bonded. The supplementary dielectric is arranged to allow efficient coupling of mechanical forces and vibrations from the top of the lead to the interface between the bottom-side conductor 783 and contact 786a. For example, the supplementary dielectric may be a material having a high modulus of elasticity as, for example, an oxide, nitride or other ceramic deposited on one of the leads or formed by chemical reaction of the lead surface. The supplementary dielectric may be thinner than the polymeric dielectric. This facilitates thermosonic or ultrasonic bonding and avoids the need for a hole in the lead structure. This is desirable where the lead is narrow. A similar structure can be used even where the first or top conductor is not bonded to a contact.

Figure 23:
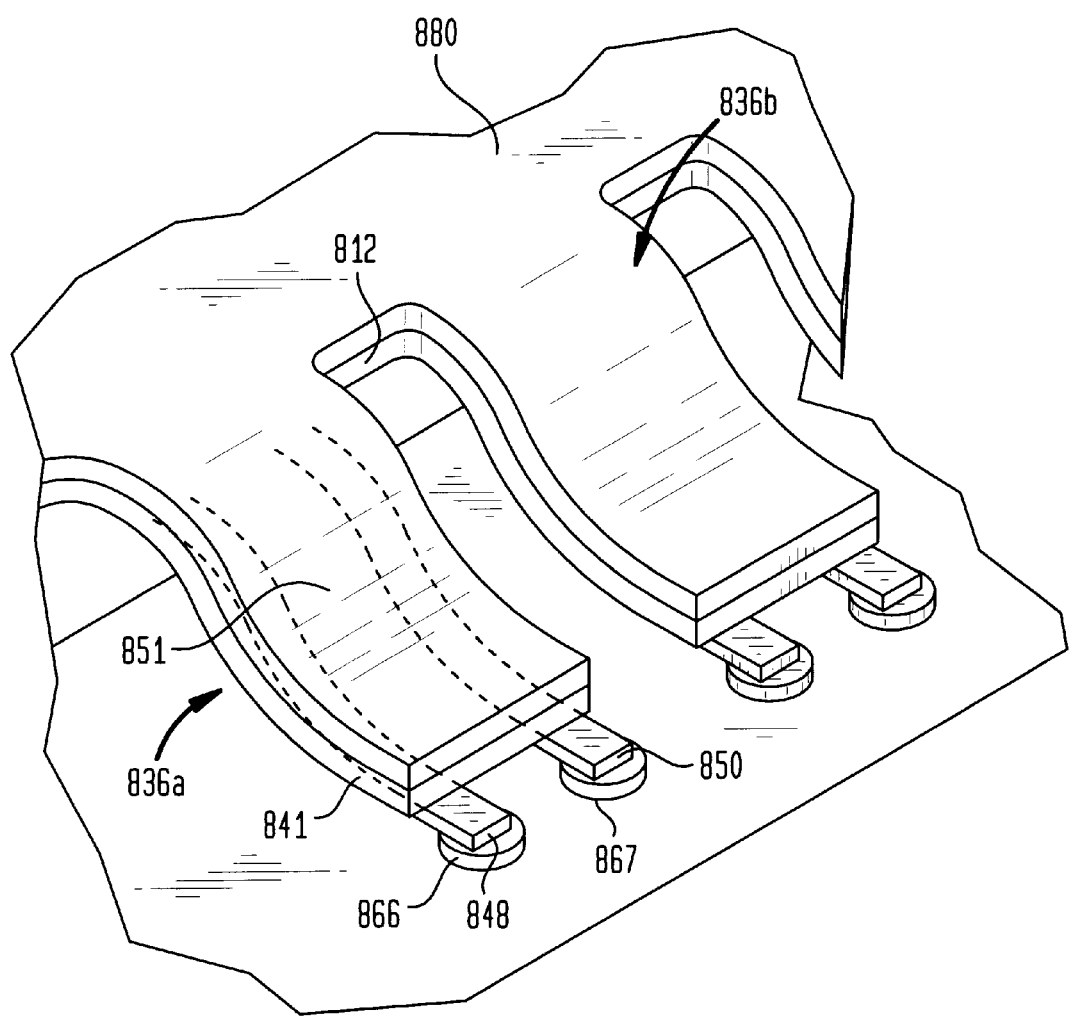
FIG. 23 is a fragmentary, diagrammatic, perspective view of an assembly in accordance with a further embodiment of the invention.

The connection component of FIG. 23 includes a plurality of leads 836a, 836b, and so on. Each lead is movable and bendable relative to support structure 812 independently of the other leads. Each lead includes two conductors 848, 850 extending along the bottom surface of a polymeric layer. The conductors of each lead can be connected to a pair of contacts 866, 867 on a chip or other microelectronic element. Because conductors 848 and 850 on each lead are disposed side-by-side, rather than in the superposed arrangement of the conductors in the other leads discussed above, these conductors typically will not provide the same amount of inter-conductor capacitance as the conductors discussed above. However, the side-by-side conductors will still provide some benefit, particularly when used in a differential signal arrangement. Preferably, each lead includes a third conductor 851 on the top surface of the dielectric layer, overlying the two conductors on the bottom surface. Conductor 851 may be connected to a potential reference source, such as a potential reference plane 880 on the support structure. Conductor 851 may also be connected to a further contact on the chip. Alternatively, two separate conductors may be provided on the top surface.

As will be readily appreciated, numerous variations and combinations of the features discussed above can be utilized without departing from the present invention as defined by the claims. Merely by way of example, the aforementioned Patents, PCT publication and patent applications disclose numerous arrangements and patterns of leads. Any of these patterns can be made in accordance with the teachings of the present invention. For example, FIGS. 1–6 illustrates a structure in which the leads and traces "fan-in" or extend inwardly from contacts at the periphery of the chip to terminals overlying the central region of the chip. However, the invention can be applied to a "fan-out" structure in which the leads extend outwardly beyond the periphery of the chip or to a "fan-in-fan-out" structure which has some leads and traces extending inwardly to terminals on a central region of the support structure and also has other leads and traces extending outwardly to terminals on the peripheral region of the support structure. Indeed, the features of the present invention can be applied to essentially any microelectronic connection component which incorporates a flexible lead structure. Numerous fabrication methods can be used to make the structures discussed above, in addition to the specific fabrication methods described herein. Also, in those embodiments where contacts on a microelectronic element are referred to as "pairs" of contacts, additional contacts may be present in the vicinity of the pair, and may even be present between the contacts of the pair. Most preferably, however, the contacts of each such pair are nearest neighbors to one another, with no intervening contact.

Figure 24:
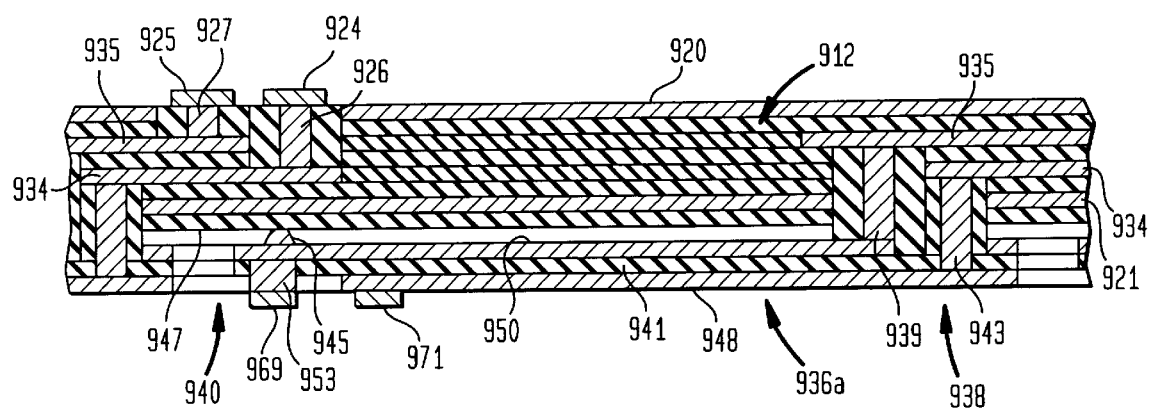
FIG. 24 is a fragmentary, sectional view depicting a connection component in accordance with a further embodiment of the invention.

A component in accordance with a further embodiment of the invention includes a multilayer dielectric support structure 912. The support structure includes potential plane elements 920 and 921 adjacent the top and bottom of the structure, and further includes internal traces 934 and 935 disposed at various layers within the substrate. Although only two potential plane elements and two layers of traces are illustrated in FIG. 24, it should be appreciated that, in practice, the structure may include numerous layers of traces and more or fewer potential plane elements. Typically, the traces within each layer extend generally parallel to one another. In the structure of FIG. 24, the two layers of traces 934 and 935 depicted in the drawing have traces extending in the same direction. Other layers (not shown) have traces extending in perpendicular directions, into and out of the plane of the drawing as seen in FIG. 24. The connection component has numerous double connection leads 936 distributed in an "area array" pattern on the bottom surface of the support structure. Each double connection lead includes a flexible dielectric, preferably polymeric strip 941, a first conductor 950 overlying the top surface of the polymeric strip and a second conductor 948 overlying the opposite, bottom surface of the strip, i.e., the surface of the strip facing away from support structure 912. A first or fixed end 938 of each lead 936 is permanently attached to the support structure 912. A first metallic vertical conductor or via 939 connects the first conductor 950 of lead 936a to a trace 935 in one layer, whereas a second vertical conductor 943 at the first end 938 of the lead connects the conductor 948 with a further trace 934 within the support structure. The vertical conductors are electrically isolated from one another and from other conductive structures on the support structure as, for example, from the potential plane element 921 on the bottom surface. Also, the second via 943 extends through the polymeric strip 941 of the lead. Again, the particular set of traces depicted in FIG. 24 is merely representative of the numerous traces included in a multilayer structure. Thus, the vias at the fixed ends of different leads 936 may be connected to traces in different layers. Preferably, however, the two vias associated with each lead are connected to traces, such as traces 934 and 935 extending parallel to one another and superposed upon one another in adjacent layers within the support structure. The two traces thus form a pair of parallel, superposed conductors separated from one another by an intervening dielectric, and hence form a transmission line with a controlled, characteristic impedance along its length. In other cases, one or both of the vias associated with a given lead may be connected to other conductive elements on the support structure as, for example, to the potential plane elements 921 or 920, or two terminals on the top surface of the support structure. Also, the vias 939 and 943 associated with each double-connection lead need not be side-by-side as illustrated. For example, the vias associated with each double connection lead may include a hollow via, and a further via inside the hollow via.

The second or tip end 940 of each double connection lead 936 is releasably connected to the bottom surface of the support structure. The releasable connection is arranged so that it is strong enough to hold the tip end of the lead in place from the time the component is manufactured until the component is used, but is weak enough that the connection can be readily broken by pulling the lead away from the bottom surface of the support structure. In the particular arrangement shown in FIG. 24, the first trace 950 is provided with a small metallic "button" 945 adjacent its tip end. This button weakly adheres to a dielectric layer 947 on the bottom surface of the support structure. As described in greater detail in the aforementioned '964 patent, metallic "buttons" of this nature can be formed by an etching process in which a relatively readily etchable metal such as copper is attached by an etchant which does not substantially attack the metal of the lead. Other structures which releasably secure the tip ends of the leads to the support structure may be employed. For example, metallic button 945 may be replaced by a polymeric connector of small cross-sectional area, such as a polymeric connector having widthwise dimensions smaller than the width of the lead. Such a polymeric connector may be readily broken by pulling the lead tip end away from the bottom surface of the support structure. As described in further detail in the co-pending, commonly assigned U.S. Patent Application of Belgacem Haba entitled "Components With Releasable Leads" and filed of even date herewith, the disclosure of which is hereby incorporated by reference herein, polymeric connecting elements of this nature can be formed by etching a polymer layer as, for example, by plasma etching in an oxygen-containing plasma.

At the tip end of each double connection lead, an electrically conductive, preferably metallic via liner 953 projects downwardly from the first conductor 950 through the polymeric dielectric strip 941. A mass 969 of an electrically conductive bonding material, which preferably is a heated-activatable bonding material as discussed above is provided on the bottom end of via 953. A mass 971 of a similar bonding material is provided at the distal end of the second conductor 948. The distal end of the second conductor terminates proximally of via 953 and mask 969, so that the tip end of the first conductor 948 remains electrically insulated from the second conductor 950 and via 953.

The component also has terminals 924 and 925 on the top surface of support structure 912. These terminals may be connected to some of the internal traces 934 and 935, as by vertical conductors or vias 926 and 927, respectively. Here again, the terminals preferably are provided in pairs, with the terminals of each pair being connected to a pair of superposed, co-directionally extending traces. Other terminals 924 and 925 may be connected to other electrically conductive features such as directed to the vias 943 and 939 associated with the leads, to the potential plane elements 920 and 921 and the like.

Figure 25:
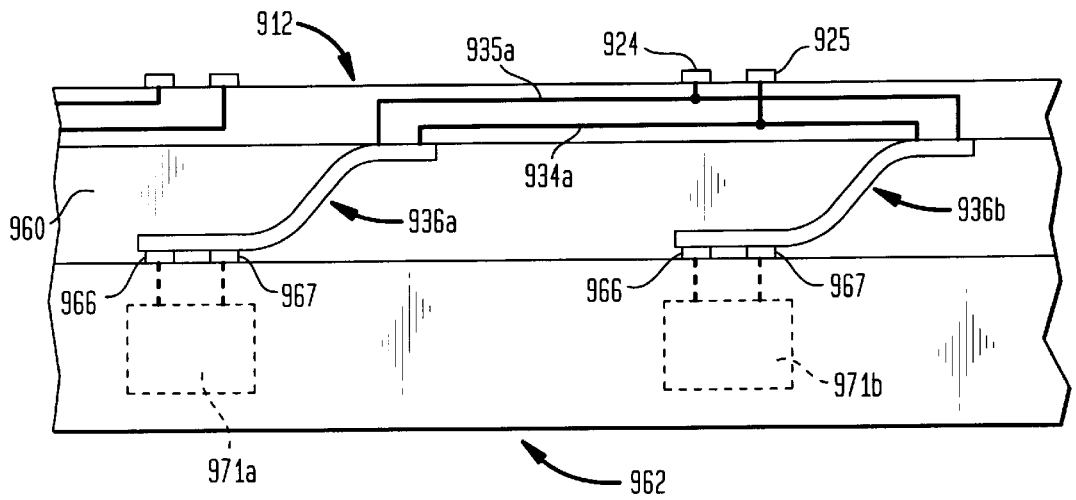
FIG. 25 is a fragmentary, diagrammatic sectional view depicting the component of FIG. 24 in conjunction with a semiconductor chip.

The component of FIG. 24 may be connected to a microelectronic element such as a semiconductor chip 562, as depicted in FIG. 25. In the connection process, the bottom surface of the connection component, with leads 936 thereon is juxtaposed with the top surface of the chip so that bonding material masses 969 and 971 on the tip ends of each lead are aligned with contacts 966 and 967 on the microelectronic element. The support structure and microelectronic element are engaged with one another under heat and pressure so that the bonding material masses 969 and 971 at the tip ends of the lead are activated to bond the via 953 (FIG. 24) associated with the first conductor 950 of each lead to a terminal 966 on the microelectronic element and to bond the second conductor 948 to another contact 967 of the same contact pair on the microelectronic element. As discussed above with reference to FIGS. 9 and 10, the support structure and microelectronic element are moved away from another to deform the leads and to detach the tip end of each lead from the support structure and to deform the leads into the vertically extensive configuration depicted in FIG. 25. As also discussed above, a compliant, dielectric encapsulant 960 is injected and cured between the support structure and the microelectronic element.

The resulting structure incorporates leads and traces in support structure 912 which interconnect two or more electronic devices 971 within the same microelectronic element or chip. The plural devices connected to one another by the interconnected traces and leads may be connected in a differential signal arrangement of the type described above with reference to FIGS. 17–18. Here again, pairs of closely spaced contacts may be associated with each device, and these pairs may be interconnected to one another by parallel conductive paths. For example, devices 971a and 971b are connected to one another by two parallel conductive paths constituted by the conductors of leads 936a and 936b and by traces 934a and 935a within the support structure. The transmission line extending between the devices has well controlled impedance over substantially all of its length and provides rapid, predictable signal transmission. The connected devices may also be connected to the terminals 924 and 925 on the top surface of the dielectric support structure as schematically depicted in FIG. 25.

As described in co-pending, commonly assigned U.S. Provisional Patent Application Nos. 60/042,187 filed Apr. 2, 1997 and 60/063,954 filed Oct. 31, 1997, the disclosures of which are hereby incorporated by reference herein, it is advantageous to provide routing from one place in a chip to another place in the same chip to a separate, external connecting element, and particularly in a separate element which is movable with respect to the chip. The support structure 912 and the internal traces of the support structure can be used for this purpose. As further described in these provisional applications, such external routing can provide a transmission line with better characteristics than those normally achievable in internal routing lines within a chip. This is particularly advantageous where the signals to be routed are high-frequency signals such as the clock signals sent from an internal clock within the chip to other elements of the chip or other signals sent between devices operating according to a common clock. This approach is especially valuable in chips operating at relatively high clock frequencies, above 100 MHz particularly above 300 MHZ. As also discussed in the last mentioned provisional applications, the traces carrying such high frequency signals may merge with one another or divide into smaller traces so as to convey the same signals to numerous locations. At each such division, the overall characteristic impedance desirably remains the same. That is, where a primary transmission line formed by a primary trace pair branches to provide several secondary transmission lines formed by second level trace pairs, the aggregate impedance of the second level transmission lines desirably is the same as the impedance of the primary transmission lines. This arrangement minimizes reflection of signals at the branching locations. Other connection components discussed above, having leads with other configurations can also be used to provide interconnections between devices on the same chip. For example, the component of FIGS. 16–18 can be used in this manner. Those structures which incorporate double connection leads are particularly suitable for such internal routing purposes.

As further disclosed in the '964 patent, a single connection component can be assembled to the front or contact bearing surface of an entire wafer containing numerous chips or else can be bonded to an assemblage of several individual chips or other microelectronic elements. Components of the type discussed above with reference to FIGS. 7–10 and with reference to FIGS. 24–25 are particularly suitable for assembly in this manner. After such assembly, the leads can be deformed into the vertically extensive configurations discussed above and the compliant layer can be formed between the support structure of the connection component and the chip or wafer front surface. The component and the wafer are then severed to provide numerous individual units, each including one or more chips and the individual portions of the connection component associated with those chips. In other arrangements, individual chips can be bonded to individual regions of a larger connection component. The connection component can then be severed to provide individual units. Conversely, individual, separate connection components can be bonded to chips while the chips are parts of a larger wafer and the wafer may then be severed to provide the individual units. In yet another variant, leads such as the double-connection leads used in the present invention can be fabricated using the process described in copending, commonly assigned U.S. Provisional Application No. 60/056,965, filed Aug. 26, 1997, the disclosure of which is hereby incorporated by reference herein.

As these and other variations and combinations of the features described above can be utilized without departing from the present invention, the foregoing description of the preferred embodiments should be taken by way of illustration rather than by way of limitation of the invention as defined by the claims.

What is claimed is:

1. A microelectronic connection component comprising:
   (a) a dielectric support structure having electrically conductive elements thereon;
   (b) a plurality of separate flexible leads having a fixed end permanently attached to said structure, and a tip end movable with respect to said structure, at least some of said leads being double connection leads, each said double connection lead including a flexible dielectric member, a first conductor and a second conductor extending codirectionally along the dielectric member, said conductors of each said double connection lead being connected to different electrically conductive elements on said support structure, said first conductor and second conductor of each said double connection lead being exposed at a bottom surface of each said lead adjacent the tip end thereof.

2. A component as claimed in claim 1 wherein said flexible dielectric member of each said double connection lead includes a flexible dielectric strip having top and bottom surfaces, said first and second conductors of said double connection leads extending along the bottom surfaces of such strips.

3. A component as claimed in claim 1 wherein said flexible dielectric member of each said double connection lead includes a flexible dielectric strip having top and bottom surfaces, said first and second conductors of each said double connection lead extending along said top and bottom surfaces, respectively.

4. A component as claimed in claim 3 wherein said dielectric members are between about 10 microns and about 50 microns thick and wherein said conductors are less than about 10 microns thick.

5. A component as claimed in claim 3 wherein said first conductor of each said double connection lead extends beyond the dielectric strip at the tip end of the lead.

6. A component as claimed in claim 5 wherein said dielectric strip of each said double connection lead has a hole adjacent the tip end of the lead, and wherein the first conductor of each said lead is exposed to the bottom of the lead through such hole.

7. A component as claimed in claim 6 wherein the first conductor of each said double connection lead has an electrically conductive projection extending downwardly through the hole in the dielectric strip of such lead.

8. A component as claimed in claim 3 wherein said support structure includes a dielectric layer having top and bottom surfaces and wherein said top and bottom surfaces of said strips are respectively continuous with the top and bottom surfaces of said dielectric layer in said support structure.

9. A component as claimed in claim 8 wherein said support structure includes a flexible dielectric sheet and wherein said strips and said sheet are formed integrally with one another.

10. A component as claimed in claim 9 wherein said strips and said support structure have the same thickness.

11. A microelectronic connection component comprising:
(a) a dielectric support structure having electrically conductive elements thereon;
(b) a plurality of separate flexible leads having a fixed end permanently attached to said structure, and a tip end movable with respect to said structure, at least some of said leads being double connection leads, each said double connection lead including a flexible dielectric member, a first conductor and a second conductor extending codirectionally along the dielectric member, said electrically conductive elements on said support structure including elongated traces electrically insulated from one another and extending along the support structure, at least some of said double connection leads having first and second conductors electrically connected to different ones of said traces.

12. A component as claimed in claim 11 further comprising terminals on said support structure, at least some of said traces being connected to said terminals.

13. A component as claimed in claim 11 further comprising an electrically conductive potential plane insulated from at least some of said traces, at least one of said conductors on at least one of said leads being electrically connected to said potential plane.

14. A component as claimed in claim 11 wherein said traces include a plurality of trace pairs, the traces of each said pair extending adjacent to one another over at least a part of the length of said traces, the traces of each said pair being connected to the first and second conductors of one said double connection lead at a first end of the pair.

15. A component as claimed in claim 14 wherein the traces of at least one said trace pair are connected to the first and second conductors of another said double connection lead at a second end of the pair.

16. A component as claimed in claim 14 further comprising terminals disposed on said support structure, at least some of said trace pairs being connected to pairs of terminals disposed adjacent to one another.

17. A component as claimed in claim 14 wherein the traces of at least some of said trace pairs extend adjacent to one another and physically parallel to one another over the entire length of such traces.

18. A microelectronic assembly comprising:
a microelectronic element having a plurality of contacts;
a connection component electrically interconnected with said microelectronic element, said connection component including a dielectric support structure and a plurality of flexible leads attached to said dielectric support structure, each said flexible lead including a flexible dielectric member, and first and second conductors extending along said flexible dielectric member, said flexible leads being connected to said microelectronic element, at least one of said flexible leads being a double connection lead having first and second conductors connected to a pair of said contacts on said microelectronic element, said first conductor of each said double connection lead being connected to a first contact of the pair, and the second conductor of each said double connection lead being connected to a second contacts of the same pair.

19. An assembly as claimed in claim 18, wherein the first and second contacts of at least some of said pairs are adjacent one another.

20. An assembly as claimed in claim 19, wherein said microelectronic element includes a plurality of electronic components, at least some of said pairs of contacts having both the first contact and the second contact electrically connected to the same component in said microelectronic element.

21. An assembly as claimed in claim 20, wherein at least one of said components is a differential signal sender arranged to send a first signal to the first contact of one said pair and to send and a second signal to the second contact of the same pair, said second signal being an inverted version of said first signal, whereby signals of opposite sense will be sent along the first and second conductors of the double connection lead connected to such pair of contacts.

22. An assembly as claimed in claim 20, wherein at least one of said components is a differential signal receiver arranged to accept a first signal from the first contact of one said pair and to accept a second signal from the second contact of the same pair, and to respond to a difference between said first and second signals.

23. An assembly as claimed in claim 21, wherein at least one of said components has a local ground node connected to at one contact of one said pair and a signal node connected to the other contact of the same pair.

24. An assembly as claimed in claim 18 further elongated conductive traces on said support structure electrically insulated from one another and extending along the support structure, at least some of said double connection leads having first and second leads electrically connected to different ones of said traces.

25. An assembly as claimed in claim 24 wherein said traces include a plurality of trace pairs, the traces of each said pair extending adjacent to one another over at least a part of the length of said traces, the traces of each said pair being connected to the first and second conductors of one said double connection lead at a first end of the pair.

26. An assembly as claimed in claim 25 wherein the traces of at least one said trace pair are connected to the first and second conductors of another said double connection lead at a second end of the pair.

27. An assembly as claimed in claim 25 further comprising terminals disposed on said support structure, at least some of said trace pairs being connected to pairs of terminals disposed adjacent to one another.

28. A method of making a microelectronic assembly comprising:
(a) providing a microelectronic element having a plurality of contacts;
(b) juxtaposing a connection component with said microelectronic element, said connection component including a dielectric support structure having electrically conductive elements thereon and a plurality of separate double connection leads attached to said dielectric support structure, each said double connection lead including a flexible dielectric member and first and second conductors connected to said conductive elements extending along said dielectric member;
(c) electrically connecting said conductive elements on said connection component to said microelectronic element by connecting the conductors of said double connection leads to pairs of contacts on said microelectronic element.

29. A method as claimed in claim 28 wherein said flexible dielectric member of each said double connection lead is a flexible dielectric strip having top and bottom surfaces, said first and second conductors of said double connection leads extending along the top and bottom surfaces of such strips, respectively.

30. A method as claimed in claim 29, wherein the contacts of each said pair are adjacent one another.

31. A method as claimed in claim 30 wherein said connecting step includes the step of engaging a bump on one contact of each pair protruding upwardly from the surface of the microelectronic element with a hole in each said polymeric strip so that each such bump extends to the first conductor of the connected lead, and engaging the other contact of each pair with the second conductor of the lead.

32. A microelectronic connection component comprising:
(a) a dielectric support structure having electrically conductive elements thereon;
(b) a plurality of separate flexible leads having a fixed end permanently attached to said structure, and a tip end movable with respect to said structure, at least some of said leads being double connection leads, each said double connection lead including a flexible dielectric member, a first conductor and a second conductor extending codirectionally along the dielectric member, said flexible dielectric member of each said double connection lead including a flexible dielectric strip having top and bottom surfaces, said first and second conductors of each said double connection lead respectively extending along said top and bottom surfaces, said dielectric strip of each said double connection lead having a hole adjacent the tip end of the lead, said conductors of each said double connection lead being connected to different electrically conductive elements on said support structure, said first conductor and second conductor of each said double connection lead being exposed at a bottom surface of each said lead adjacent the tip end thereof and said first conductor of each said lead being exposed to the bottom of the lead through said hole.

33. A microelectronic connection component comprising:
(a) a dielectric support structure having electrically conductive elements thereon;
(b) a plurality of separate flexible leads having a fixed end permanently attached to said structure, and a tip end movable with respect to said structure, at least some of said leads being double connection leads, each said double connection lead including a flexible dielectric member, a first conductor and a second conductor extending codirectionally along the dielectric member, said dielectric strip of each said double connection lead having a hole adjacent the tip end of the lead and said first conductor of each said lead being exposed to the bottom of the lead through said hole, said electrically conductive elements on said support structure including elongated traces electrically insulated from one another and extending along the support structure, at least some of said double connection leads having first and second conductors electrically connected to different ones of said traces.

34. A microelectronic assembly comprising:
a microelectronic element having a plurality of contacts;
a connection component electrically interconnected with said microelectronic element, said connection component including a dielectric support structure and a plurality of flexible leads attached to said dielectric support structure at one end and a tip end moveable relative to said support structure, each said flexible lead including a flexible dielectric member, and first and second conductors extending along said flexible dielectric member, said flexible leads being connected to said microelectronic element, at least one of said flexible leads being a double connection lead having first and second conductors connected to a pair of said contacts on said microelectronic element, said dielectric strip of each said double connection lead having a hole adjacent the tip end of the lead and said first conductor of each said lead being exposed to the bottom of the lead through said hole, said first conductor of each said double connection lead being connected to a first contact of the pair, and the second conductor of each said double connection lead being connected to a second contacts of the same pair.

35. A method of making a microelectronic assembly comprising:
(a) providing a microelectronic element having a plurality of contacts;
(b) juxtaposing a connection component with said microelectronic element, said connection component including a dielectric support structure having electrically conductive elements thereon and a plurality of separate double connection leads attached to said dielectric support structure, each said double connection lead including a flexible dielectric member and first and second conductors connected to said conductive elements extending along said dielectric member, said dielectric strip of each said double connection lead having a hole adjacent the tip end of the lead and said first conductor of each said lead being exposed to the bottom of the lead through said hole;
(c) electrically connecting said conductive elements on said connection component to said microelectronic element by connecting the conductors of said double connection leads to pairs of contacts on said microelectronic element.

* * * * *

UNITED STATES PATENT AND TRADEMARK OFFICE
CERTIFICATE OF CORRECTION

PATENT NO. : 6,239,384 B1
DATED : May 29, 2001
INVENTOR(S) : John W. Smith and Joseph Fjelstad It is certified that error appears in the above-identified patent and that said Letters Patent is hereby corrected as shown below:

Title page, Title and Column 1, line 1,
"MICROELECTRIC" should read -- MICROELECTRONIC --.

Column 5,
Line 20, after "thick" insert -- , --.

Column 6,
Line 67, after "substrate" insert -- . --.

Column 11,
Line 34, "elastome" should read -- elastomer --.
Line 36, "luctive" should read -- conductive --.

Column 12,
Line 50, "a" should read -- an --.

Column 15,
Line 58, after "358'" insert -- is --.

Column 16,
Line 36, "566A" should read -- 566a --.

Column 18,
Line 60, "win" should read -- will --.

Column 19,
Line 53, "666B" should read -- 666b --.

UNITED STATES PATENT AND TRADEMARK OFFICE
CERTIFICATE OF CORRECTION

PATENT NO. : 6,239,384 B1
DATED : May 29, 2001
INVENTOR(S) : John W. Smith and Joseph Fjelstad It is certified that error appears in the above-identified patent and that said Letters Patent is hereby corrected as shown below:

Column 20,
Line 11, cancel "of".
Line 22, after "shown)" insert -- , --.

Column 23,
Line 12, after "from" insert -- one --.
Line 57, "MHZ" should read -- MHz --.

Column 26,
Line 5, after "and" insert -- are --.
Line 24, "contacts" should read -- contact --.
Line 37, cancel "and" (second occurrence).
Line 50, cancel "at".
Line 52, after "further" insert -- comprising --.

Column 28,
Line 42, "contacts" should read -- contact --.

Signed and Sealed this

Eleventh Day of December, 2001

Attest:

*Nicholas P. Godici*

NICHOLAS P. GODICI
*Attesting Officer*   *Acting Director of the United States Patent and Trademark Office*